United States Patent
Lim et al.

(10) Patent No.: US 10,860,129 B2
(45) Date of Patent: Dec. 8, 2020

(54) ELECTRONIC DEVICE

(71) Applicants: Samsung Display Co., Ltd., Yongin-si (KR); Research & Business Foundation SUNGKYUNKWAN UNIVERSITY, Suwon-si (KR)

(72) Inventors: Jaeik Lim, Hwaseong-si (KR); Wonsang Park, Yongin-si (KR); Hyeyong Chu, Hwaseong-si (KR); Juhyun Kim, Seongnam-si (KR); Nae-eung Lee, Seoul (KR); Byeong-ung Hwang, Pohang-si (KR)

(73) Assignees: Samsung Display Co., Ltd., Yongin-si (KR); Research Business Foundation SUNGKYUNKWAN UNIVERSITY, Suwon-si (KR)

( * ) Notice: Subject to any disclaimer, the term of this patent is extended or adjusted under 35 U.S.C. 154(b) by 15 days.

(21) Appl. No.: 15/862,483

(22) Filed: Jan. 4, 2018

(65) Prior Publication Data
US 2018/0300006 A1    Oct. 18, 2018

(30) Foreign Application Priority Data
Apr. 14, 2017    (KR) .................. 10-2017-0048737

(51) Int. Cl.
*G06F 3/041* (2006.01)
*H01L 21/02* (2006.01)
(Continued)

(52) U.S. Cl.
CPC ............ *G06F 3/0414* (2013.01); *G06F 3/044* (2013.01); *G06F 3/0412* (2013.01);
(Continued)

(58) Field of Classification Search
CPC .... G06F 3/0414; G06F 3/0412; G06F 3/0416; G06F 3/044; H01L 21/02603; H01L 21/02617; H05L 51/0048; H05K 1/09
See application file for complete search history.

(56) References Cited

U.S. PATENT DOCUMENTS

| | | |
|---|---|---|
| 9,116,570 B2 | 8/2015 | Lee et al. |
| 9,324,733 B2 | 4/2016 | Rogers et al. |
| (Continued) | | |

FOREIGN PATENT DOCUMENTS

| | | |
|---|---|---|
| KR | 10-1274121 | 6/2013 |
| KR | 10-2014-0026934 | 3/2014 |
| (Continued) | | |

OTHER PUBLICATIONS

Chan Woo Park et al, Locally-tailored structure of an elastomeric substrate for stretchable circuits, Semiconductor Science and Technology, 2016, pp. 1-6, IOP Publishing Ltd, United Kingdom.
(Continued)

*Primary Examiner* — Carolyn R Edwards
(74) *Attorney, Agent, or Firm* — H.C. Park & Associates, PLC

(57) ABSTRACT

An electronic device comprises a base substrate changing a cross section area corresponding to an external force applied from outside and a sensor changing a cross section area corresponding to the external force applied from outside. The sensor comprises a first electrode disposed on the base substrate, a second electrode disposed on the base substrate, and a dielectric layer disposed between the first electrode and the second electrode. A thickness of the dielectric layer stays substantially the same when a cross sectional area of the base substrate changes.

25 Claims, 19 Drawing Sheets

(51) Int. Cl.
*H05K 1/09* (2006.01)
*H01L 51/00* (2006.01)
*G06F 3/044* (2006.01)
*H01L 27/32* (2006.01)

(52) U.S. Cl.
CPC ...... *G06F 3/0416* (2013.01); *H01L 21/02603* (2013.01); *H01L 21/02617* (2013.01); *H01L 51/0048* (2013.01); *H05K 1/09* (2013.01); *G06F 2203/04106* (2013.01); *H01L 27/323* (2013.01)

(56) References Cited

U.S. PATENT DOCUMENTS

| | | | | |
|---|---|---|---|---|
| 2008/0202251 | A1* | 8/2008 | Serban | H03K 17/962 73/780 |
| 2009/0135150 | A1* | 5/2009 | Takashima | B32B 27/08 345/173 |
| 2011/0006787 | A1* | 1/2011 | Kadono | G06F 3/044 324/658 |
| 2011/0181548 | A1* | 7/2011 | Sekiguchi | G06F 3/044 345/174 |
| 2012/0086666 | A1* | 4/2012 | Badaye | G06F 3/0416 345/174 |
| 2012/0218221 | A1* | 8/2012 | Igeta | G06F 3/0445 345/174 |
| 2012/0256876 | A1* | 10/2012 | Yeh | G06F 3/044 345/174 |
| 2013/0047747 | A1* | 2/2013 | Joung | G01L 1/146 73/862.68 |
| 2014/0150572 | A1* | 6/2014 | Lim | H03K 17/975 73/862.626 |
| 2014/0218872 | A1 | 8/2014 | Park et al. | |
| 2015/0277617 | A1* | 10/2015 | Gwin | G06F 3/044 345/174 |
| 2016/0052517 | A1* | 2/2016 | Connolly | B60K 6/48 701/22 |
| 2016/0170543 | A1* | 6/2016 | Kawamura | G06F 3/044 345/174 |
| 2016/0274724 | A1* | 9/2016 | Chang | G06F 3/044 |
| 2016/0282999 | A1* | 9/2016 | Hwang | G01L 7/024 |
| 2016/0291729 | A1* | 10/2016 | Schardt | H01L 41/45 |
| 2016/0313846 | A1 | 10/2016 | Hong et al. | |
| 2017/0083107 | A1* | 3/2017 | Shim | G06F 3/0202 |
| 2017/0097315 | A1 | 4/2017 | Lee et al. | |
| 2017/0139513 | A1* | 5/2017 | Hong | G02F 1/167 |
| 2017/0177114 | A1* | 6/2017 | Frey | G01L 1/142 |
| 2018/0150173 | A1* | 5/2018 | Han | G06F 3/044 |

FOREIGN PATENT DOCUMENTS

| | | |
|---|---|---|
| KR | 10-2014-0100299 | 8/2014 |
| KR | 10-1715501 | 3/2017 |

OTHER PUBLICATIONS

Youngeun Jeon et al, Highly Flexible Touch Screen Panel Fabricated with Silver Nanowire Crossing Electrodes and Transparent Bridges, Journal of the Optical Society of Korea, Oct. 2015, pp. 508-513, vol. 19, No. 5, Republic of Korea.

Shanshan Yao et al, Wearable multifunctional sensors using printed stretchable conductors made of silver nanowires, Nanoscale, 2014, pp. 2345-2352, The Royal Society of Chemistry 2014.

Han-Byeol Lee et al, Mogul-Patterned Elastomeric Substrate for Stretchable Electronics, wileyonlinelibrary.com, pp. 3069-3077, Wiley-VCH Verlag GmbH & Co. KGaA, Weinheim.

* cited by examiner

ELECTRONIC DEVICE

CROSS REFERENCE TO RELATED APPLICATION

This application claims priority from and the benefit of Korean Patent Application No. 10-2017-0048737, filed on Apr. 14, 2017, which is hereby incorporated by reference for all purposes as if fully set forth herein.

BACKGROUND

Field

Exemplary embodiments of the present disclosure relate to an electronic device, and more particularly to an electronic device being able to sense a touch.

Discussion of the Background

An electronic device is activated by receiving an electric signal. The electronic device includes a display apparatus displaying an image and a touch screen sensing a touch applied from an outside.

The electronic device may include diverse conductive patterns to be activated by an electric signal. An area at which the conductive patterns are activated displays information or shows a response to a touch from outside. Therefore, the electronic device may provide touch information by sensing an applied touch, or may operate diverse applications based thereon. Accordingly, this disclosure provides an electronic device capable of sensing touch location and touch intensity applied from the outside.

The above information disclosed in this Background section is only for enhancement of understanding of the background of the inventive concepts. Therefore, it may contain information that does not form the prior art that was already known to a person of ordinary skill in the art or was publically available prior to an effective filing date of subject matter disclosed herein.

SUMMARY

An exemplary embodiment provides an electronic device that includes a base substrate configured to change an area in a plan view corresponding to an external force applied from outside, and a sensor disposed on the base substrate configured to sense a touch applied from the outside and change an area in the plan view corresponding to the external force applied from the outside. The sensor comprises a first electrode disposed on the base substrate, a second electrode disposed on the base substrate and forming an electric field with the first electrode, and a dielectric layer disposed between the first electrode and the second electrode. A thickness of the dielectric layer when the base substrate has a first area in the plan view is substantially the same as a thickness of the dielectric layer when the base substrate has a second area in the plan view different from the first area.

The area in the plan view may be a projected area in the plan view.

The base substrate may comprise the first area in a first mode in which the external force is 0 MPa and the second area in a second mode in which the external force is bigger than 0 MPa.

The second area may be larger than the first cross-sectional area.

The upper surface area of the dielectric layer in the first mode may be substantially the same as the upper surface are of the dielectric layer in the second mode.

The projected area of the dielectric layer in the first mode may be smaller than the projected area of the dielectric layer in the second mode.

The upper surface of the base substrate may comprise a plurality of concave portions and convex portions.

The base substrate may include a plurality of peak intervals and valley intervals defining the plurality of concave portions and convex portions.

A lower surface of the base substrate may be flat.

A thickness of the base substrate in the first mode may be thicker than a thickness of the base substrate in the second mode.

A thickness of the dielectric layer in an overlapped area with the peak intervals may be substantially the same as the thickness of the dielectric layer in the area overlapped with valley intervals.

The second electrode may comprise a piezo-resistance material.

The first electrode and the second electrode may comprise the same material.

The first electrode and the second electrode may be optically transparent.

The first electrode and the second electrode may comprise a different material.

A first electrode thickness when the base substrate has a first area may be different from a first electrode thickness when the base substrate has a second area.

An exemplary embodiment also provides an electronic device that includes a base substrate with elasticity comprising an upper surface defined by concave portions and convex portions and a sensor disposed on the upper surface to sense a touch applied from the outside.

The sensor may comprise a first electrode disposed on the upper surface, a second electrode disposed on the first electrode and comprising a piezo-resistance material, and a dielectric layer with elasticity disposed between the first electrode and the second electrode.

The sensor may sense a location and intensity of the touch.

Resistance of the second electrode may be inversely proportionate to the intensity of the touch.

The base substrate may include a first area in a first mode in which a first external force is applied from the outside and a second area in a second mode in which a second external force which is greater than the first external force is applied.

The base substrate may be alternately arranged and comprises peak intervals and valley intervals defining concave portions and convex portions, wherein a height of each of peak interval and a depth of each of valley interval may be different from each other in the first mode and the second mode.

A thickness variation of the first electrode according to the first external force may be different from a thickness variation of the second external force according to the second external force.

The sensor may sense an elongation degree of the base substrate.

A thickness of the dielectric layer in the first mode may be substantially the same as a thickness of the dielectric layer in the second mode.

An area of the upper surface of the second electrode may be substantially the same in the first mode and the second mode.

The electronic device further may comprise a display layer disposed between the base substrate to display an image, wherein the first electrode and the second electrode are optically transparent.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure, and together with the description serve to explain the principles of the disclosure.

DETAILED DESCRIPTION OF THE ILLUSTRATED EMBODIMENTS

Figure 1:
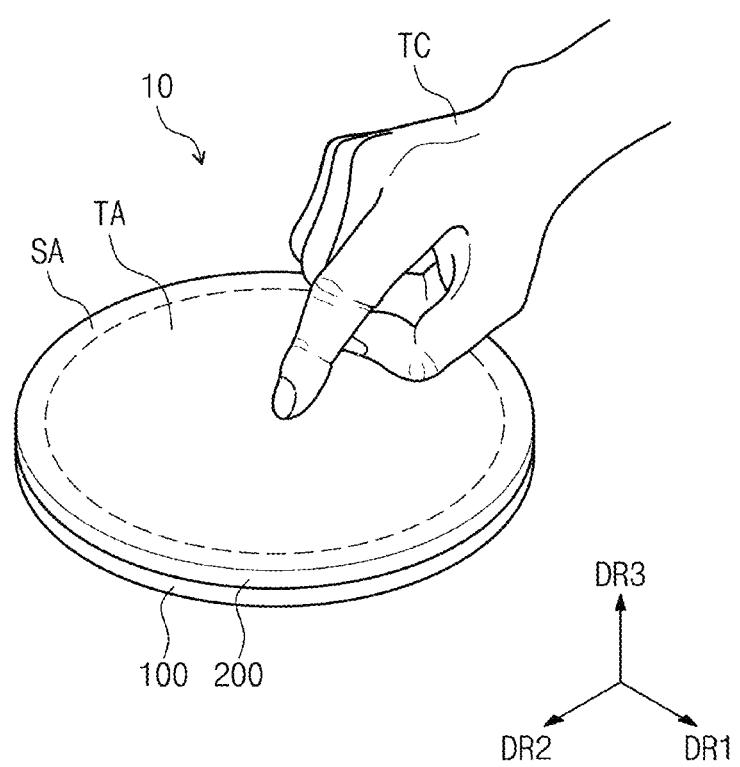
FIG. 1 is a perspective view showing an electronic device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein Hereinafter, the present disclosure will be explained in detail with reference to the accompanying drawings.

Figure 2A:
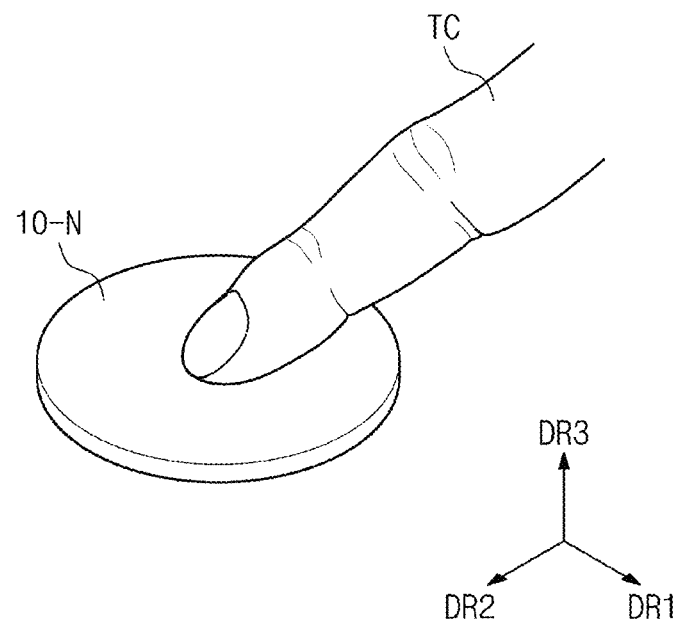
FIG. 2A and FIG. 2B are perspective views showing states according to first and second modes of the electronic device shown in FIG. 1.
Figure 2B:
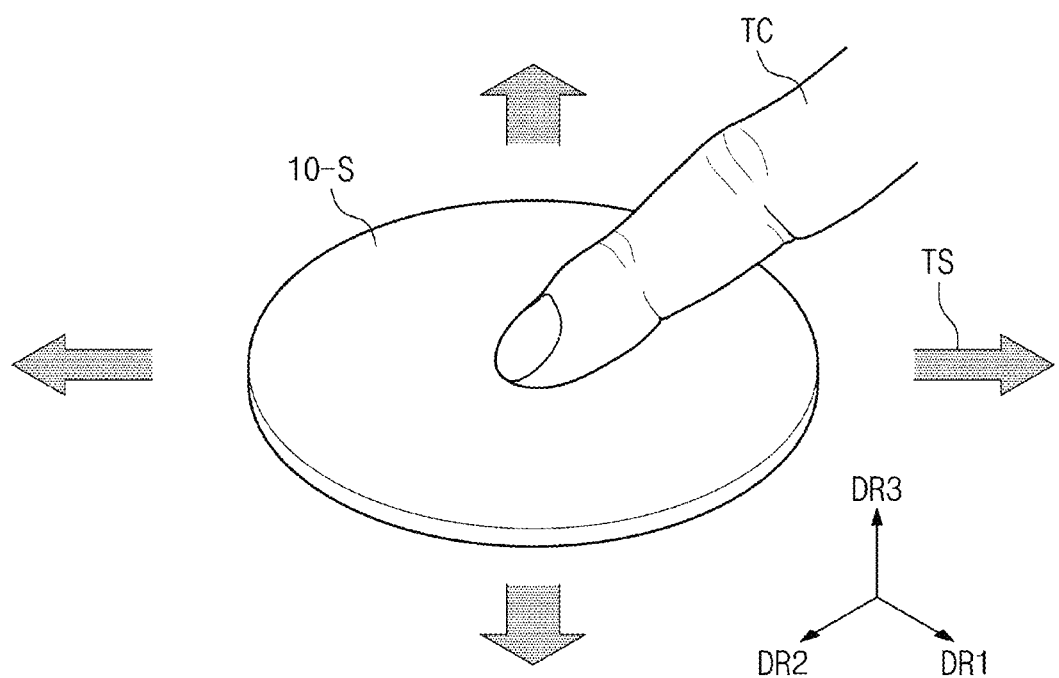

FIG. 1 is a perspective view showing an electronic device according to an exemplary embodiment of the present disclosure, FIG. 2A and FIG. 2B are perspective views showing states according to modes of the electronic device shown in FIG. 1. Hereinafter, the present disclosure will be explained in detail with reference to the FIG. 2A and FIG. 2B.

As shown in FIG. 1, an electronic device 10 includes a base substrate 100 and a sensor 200. In an exemplary embodiment, the electronic device 10 is a circular shape defined by a first direction DR1 and a second direction DR2 and is a circular plate with a predetermined thickness in a third direction DR3. However, the illustrated shapes are merely exemplary and the electronic device 10 may have diverse shapes, such as polygonal plate shape, a circular shape, or an elliptical shape, without departing from the scope of the inventive concepts.

The electronic device 10 may be divided into a touch area TA and a peripheral area SA. The touch area TA may be an area for generating an electrical signal after sensing a touch TC applied from the outside.

The peripheral area SA is arranged adjacent to the touch area TA. The peripheral area SA may not be activated even the touch TC is provided. Meanwhile, the peripheral area SA may be omitted in the electronic device 10 according to one exemplary embodiment of this disclosure.

Referring to FIG. 1, FIG. 2A, and FIG. 2B, the electronic device 10 may have elasticity. An area of the electronic device 10 may be increased or decreased by the force applied from the outside. FIG. 2A and FIG. 2B show touch states in which a touch TC is provided to the electronic device 10 in two modes. The two modes are distinct from an area state of the electronic device 10 which is changed by an externally applied force.

FIG. 2A illustrates an electronic device 10-N in a normal mode. The normal mode may have no an external force. That is, the external force applied to the electronic device 10-N may be 0 MPa in the normal mode.

The electronic device 10-N in a normal mode may substantially correspond to the electronic device 10 of FIG. 1, and there may be no change in area in the electronic device 10. When a touch TC is provided to the electronic device 10-N, the electronic device 10-N senses the touch TC and generates an electric signal.

FIG. 2B illustrates an electronic device 10-N in a strain mode. The strain mode may be a state in which there is an external force. That is, the external force applied to the electronic device 10-S may be greater than 0 MPa in the strain mode.

The electronic device 10-S in the strain mode may be a state in which the electronic device 10 changes the area by an external force. Accordingly, the area of the electronic device 10-S in the strain mode may be greater than the area of the electronic device 10-N.

In an exemplary embodiment, the external force TS may be a tensile stress which is applied to the electronic device 10 in a perpendicular direction to the third direction DR3. The external force TS may be a force having various directions.

For example, the external force TS may be a force parallel or intersectional to the first direction DR1 or the second direction DR2. When the external force TS is a perpendicular direction to the third direction DR3, the external force TS may have diverse directions, but exemplary embodiments should not be limited thereto. Meanwhile, the direction of the external force TS may include a direction of polarized force.

For the same touch TS in the electronic device 10 according to one exemplary embodiment, the sense degree of the electronic device 10-N in a normal mode may be substantially the same as the sense degree of the electronic device 10-S in a strain mode. Again, for the same touch TS, an electric signal generated by the electronic device 10-N in the normal mode may be correspond to the electric signal generated by the electronic device 10-S in the strain mode.

Accordingly, a touch sense characteristic may be able to maintain uniformly though the shape of the electronic device 10 is varied by the externally applied force. A detailed description over this will be described in detail later.

Referring to FIG. 1, the electronic device 10 may include a base substrate 100 and a sensor 200. The base substrate 100 and the sensor 200 may be stacked along the third direction DR3. However, this is shown as an example, and additional components may be arranged between the base substrate 100 and the sensor 200, but exemplary embodiments should not be limited thereto.

The base substrate 100 may include a material with elasticity. In this disclosure, the elasticity means that it is easy to stretch by an external force, and has resilience and restoring force which can be easily returned to the original state when the external force is removed. The elasticity of the base substrate 100 may be deformed over about 30%.

An area in a plan view of the base substrate 100 may be varied depending on the tensile force applied from the outside. An area in the plan view may be an area which is projected on the plane in the plan view.

The base substrate 100 may include an insulation material with elasticity. The base substrate 100 may include a material having predetermined cushion. For example, the base substrate 100 may include at least one of polydimethylsiloxane PDMS, Eco flex, and polyurethane PU. The base substrate 100 may include diverse materials when the base substrate 100 includes insulation material with elasticity, but it should not be limited to any one exemplary embodiment.

The sensor 200 is disposed on the base substrate 100. The sensor 200 senses the touch TC applied from the outside. The sensor 200 generates an electric signal corresponding to a sensed touch TC and provides it to the outside. The electronic device 10 may provide information relating to the touch TC by way of the sensor 200.

The sensor 200 may sense diverse information which is related to the touch TC. The information for the touch TC may include location information and intensity information applied from the touch TC. Meanwhile, this is shown as an example, and the information about the touch TC which is sensed by the sensor 200 may include various factors, but it is not limited any one exemplary embodiment.

The sensor 200 may include elasticity. The elasticity of the sensor 200 may be greater than that of the base substrate 100. Therefore, the sensor 200 can easily respond to the shape change of the base substrate 100, and may have improved reliability for the external force. A detailed description for the sensor 200 will be described in detail later.

Figure 3A:
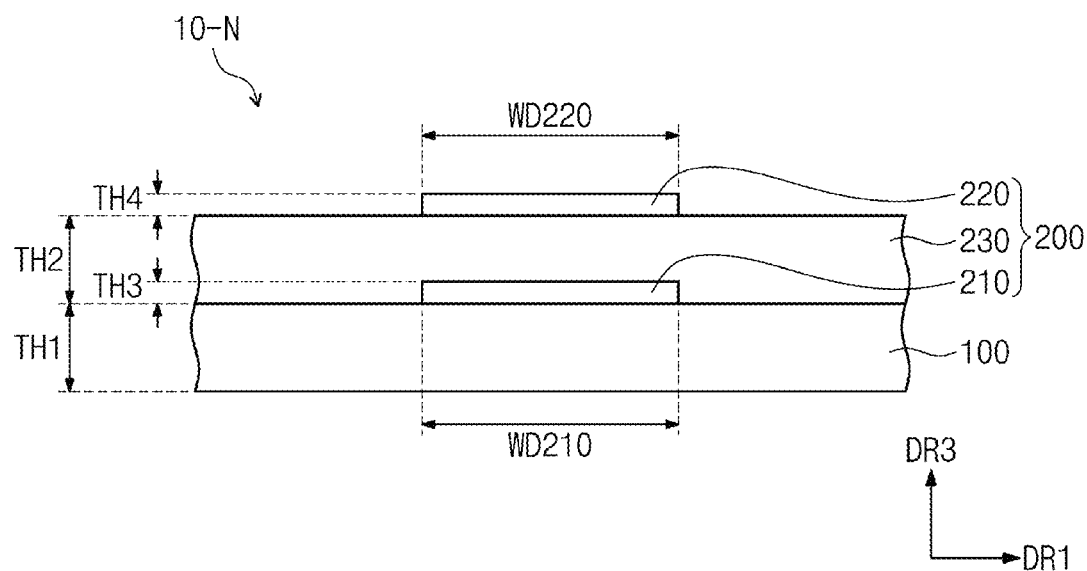
FIG. 3A and FIG. 3B are partial cross-sectional views of the electronic device shown in FIG. 1.
Figure 3B:
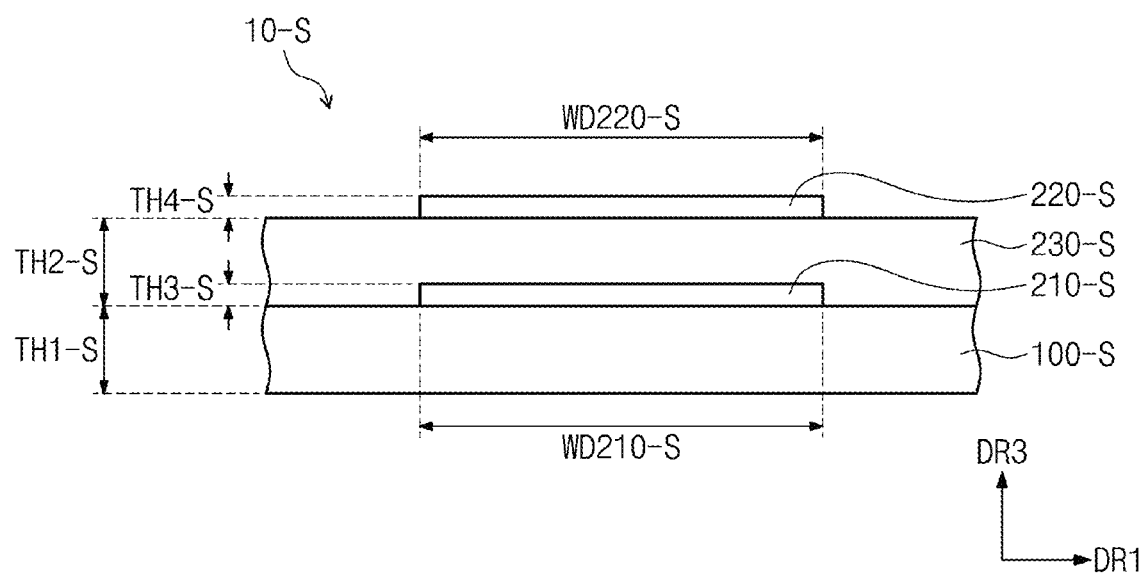

FIG. 3A and FIG. 3B are partial cross-sectional views of the electronic device shown in FIG. 1. For the convenience of explanation, one part of the normal mode electronic device 10-N corresponding state to the FIG. 2A is depicted in FIG. 3A, and one part of the strain mode electronic device 10-S corresponding state to the FIG. 2B is depicted in FIG. 3B.

Hereinafter, the electronic device according to the present exemplary embodiment will be described with reference the FIG. 3A and FIG. 3B. As for the explained configuration and the same configuration described in FIG. 1 to FIG. 2B, the same reference number will be used and a detailed description will be omitted.

As described above, since the normal mode electronic device 10-N corresponds to the electronic device in which no external force is applied, the normal mode electronic device 10-N is substantially the same as the electronic device 10 shown in FIG. 1. Hereinafter, the normal mode electronic device 10-N will be described as a corresponding device to the electronic device 10 shown in FIG. 1.

As described above, the strain mode electronic device 10-S may be in a state in which a predetermined external force is provided. The strain mode electronic device 10-S may be restored to the normal mode electronic device 10-N when the external force is removed. In this exemplary embodiment, the external force existing in the strain mode electronic device 10-S is not shown.

As shown in FIG. 3A, a sensor 200 includes a first electrode 210, a second electrode 220, and a dielectric layer 230. The first electrode 210 is disposed on the base substrate 100. A plurality of first electrodes 210 are provided and disposed on the base substrate 100 to be spaced apart from each other.

The first electrode 210 may have elasticity. Accordingly, the first electrode 210 can be stretched and deformed in a stable manner corresponding to the elongation and contraction of the base substrate 100.

The first electrode 210 may include a conductive material with elasticity. The first electrode 210 may include an optically transparent material.

For example, the first electrode 210 may include a piezo-resistance material. Further, the first electrode 210 may be formed of the mixture of at least one selected from the group consisting of transparent material such as indium tin oxide ITO, silver nanowire AgNW, carbon nanotube CNT, graphene, poly(3,4-ethylenedioxythiophene):poly(4-styrene sulfonate)(poly(3,4-ethylenedioxythiophene):poly(4-styrenesulfonate), PEDOT:PSS), polyacetylene, polyparaphenylene, polypyrrole and polyaniline and at least one selected from the group consisting of elastic material such as polydimethylsiloxane PDMS, Ecoflex and polyurethane PU.

The second electrode 220 is disposed on the base substrate 100. The second electrode 220 may be disposed on the first electrode 210. In this exemplary embodiment, the second electrode 220 may be disposed to overlap with the first electrode 210.

A touch TC is provided to the upper side of the sensor 200. Therefore, the touch TC can be more closely provided to the second electrode 220 than the first electrode 210.

The second electrode 220 may include a plurality of conductive patterns. The second electrode 220 may include a conductive material with elasticity. The second electrode 220 may include a transparent material.

For example, the second electrode 220 may include a piezo-resistance material. Further, the second electrode 220 may be formed of the mixture of at least one selected from the group consisting of transparent material such as indium tin oxide ITO, silver nanowire AgNW, carbon nanotube CNT, graphene, poly(3,4-ethylenedioxythiophene):poly(4-styrene sulfonate)(poly(3,4-ethylenedioxythiophene):poly (4-styrenesulfonate), PEDOT:PSS), polyacetylene, polyparaphenylene, polypyrrole and polyaniline and at least one selected from the group consisting of elastic material such as polydimethylsiloxane PDMS, Ecoflex and polyurethane PU.

In this disclosure, the second electrode 220 may include a material with high piezo-resistance. The second electrode 220 may be provided in the sensor 200 which is the closest thing to the touch TC. The other electronic device according to an exemplarily embodiment may have improved sensitivity to the intensity of the touch TC as the second electrode 220 is formed of a high piezo-resistance material.

This is shown as an example, however, each of the first electrode 210 and the second electrode 220 may include diverse materials, and it is not limited to any one particular exemplary embodiment.

The dielectric layer 230 may be provided between the first electrode 210 and the second electrode 220. The dielectric layer 230 may be provided to overlap with each of the first electrode 210 and the second electrode 220.

A shape of the dielectric layer 230 may be deformed by the external force TS. The dielectric layer 230 can stretch over about 10% and has elasticity to be able to restore to the original state when the external force is removed.

The dielectric layer 230 may include an insulation material with elasticity. For example, the dielectric layer 230 may include one or more material selected from the group consisting of polydimethylsiloxane PDMS, Ecoflex, and polyurethane PU which have elasticity.

Also, the dielectric layer 230 may include a nanoparticle. For example, the dielectric layer 230 may be formed of mixture which is above described material with elasticity and oxides such as aluminium oxide Al2O3, hafnium oxide HfO2, zirconium oxide ZrO2, barium titanium oxide BaTiO3, titanium oxide TiO2. Then, a dielectric constant of the dielectric layer 230 may be designed differently by controlling the distribution or volume of the oxide particle for the dielectric layer 230.

In this disclosure, the base substrate 100 and the sensor 200 have their elasticity. Accordingly, the normal mode electronic device 10-N and the strain mode electronic device 10-S have the same configuration, but there may be a different point resulting from the shape change. The electronic device 10 may stably relieve the stress, which is result from the external force TS provided to the electronic device 10, by changing the shape.

The change of the shape may include a thickness change in the third direction DR3 of each component and a change of an area in the plan view of each component. As described above, the area in the plan view may be a projected area defined by the first direction DR1 and the second direction DR2.

The thickness in this disclosure may be a thickness defined by the third direction DR3, and also the area may be a projected area defined by the first direction DR1 and the second direction DR2. Therefore, an area of the upper surface of each of the configurations and an area of the plane of each of the configurations may be the same or different according to the shape of each configuration.

The base substrate 100 may be deformed to the strain mode base substrate 100-S by the external force. A thickness TH1-S of the strain mode base substrate 100-S may be different from the thickness TH1 of the normal mode base substrate 100. A thickness TH1-S of the strain mode base substrate 100-S may be thinner than the thickness TH1 of the normal mode base substrate 100.

The dielectric layer 230 may be transformed to the strain mode dielectric layer 230-S by the external force. A thickness TH2-S of the strain mode dielectric layer 230-S may be substantially the same as the thickness TH2 of the normal mode dielectric layer 230.

As the dielectric layer 230 maintains its thickness even though the external force is applied so that the capacitance of the sensor 200 may not be changed by applying the external force. Thus, though the sensor 200 has deformed its shape due to the external force, it is possible to prevent a problem of the deterioration of touch sensitivity.

The first electrode 210 may be transformed to the strain mode first electrode 210-S, and the second electrode 220 may be transformed to the strain mode second electrode 220-S.

A difference between a thickness TH3-S of the strain mode first electrode 210-S and a thickness TH3 of the normal mode first electrode 210 which has no external force is absent or very small. A difference between a thickness TH4-S of the strain mode second electrode 220-S and a thickness TH4 of the normal mode second electrode 220 which has no external force is absent or very small. Accordingly, an effect to the touch sensitivity of the sensor 200 resulting from the thickness change of the first electrode 210 and the second electrode 220 due to the external force may be small.

Meanwhile, a width WD210-S in the first direction DR1 of the strain mode first electrode 210-S is different from a width WD210 in the first direction DR1 of the normal mode first electrode 210 which has no external force, and a width WD220-S in the first direction DR1 of strain mode second electrode 220-S is different from a width WD220 in the first direction DR1 of the normal mode second electrode 220 which has no external force Each of the width WD210 of the first electrode 210 and the width WD220 of the second electrode may relate to a projected area. Because of the external force, an area in the plan view of the strain mode first electrode 210-S may be bigger than the area in the plan view of the normal mode first electrode 210 which has no external force, and an area in the plan view of the strain mode second electrode 220-S may be bigger than the area in the plan view of the normal mode second electrode 220 which has no external force.

An actual area of the upper surface of the strain mode first electrode 210-S is substantially the same as the actual area of the upper surface of the first electrode 210. An actual area of the upper surface of the strain mode second electrode 220-S is substantially the same as the actual area of the upper surface of the second electrode 220.

The upper surface of the first electrode 210-S and the area of the upper surface of the second electrode 220 can be changed by the change of the upper surface area of the base substrate 100. The base substrate 100 releases the stress resulting from the external force by way of thickness change and maintains the unchanged actual area of the upper surface.

Therefore, an actual area of the upper surface of the strain mode first electrode 210-S and an actual area of the upper surface of the strain mode second electrode 220-S may maintain substantially the same area as the area of normal mode on which the external force is not applied.

A touch sensitivity of the sensor 200 may relate to an actual upper surface area of the first electrode 210, an actual upper surface area of the second electrode 220, and a capacitance defined by the thickness of the dielectric layer 230.

The actual upper surface area of the first electrode 210, an actual upper surface area of the second electrode 220, and the dielectric layer 230 may maintain uniformly their thickness even when a thickness TH1-S of the strain mode base substrate 100-S is transformed from the thickness TH1 of the normal mode base substrate 100 due to the external force TS.

A normal mode electronic device 10-N and a strain mode electronic device 10-S can substantially maintain uniformly touch sensitivity. So, it is possible to realize an electronic device being able to provide stable touch environment to a user even a shape is deformed by the external force.

Figure 4A:
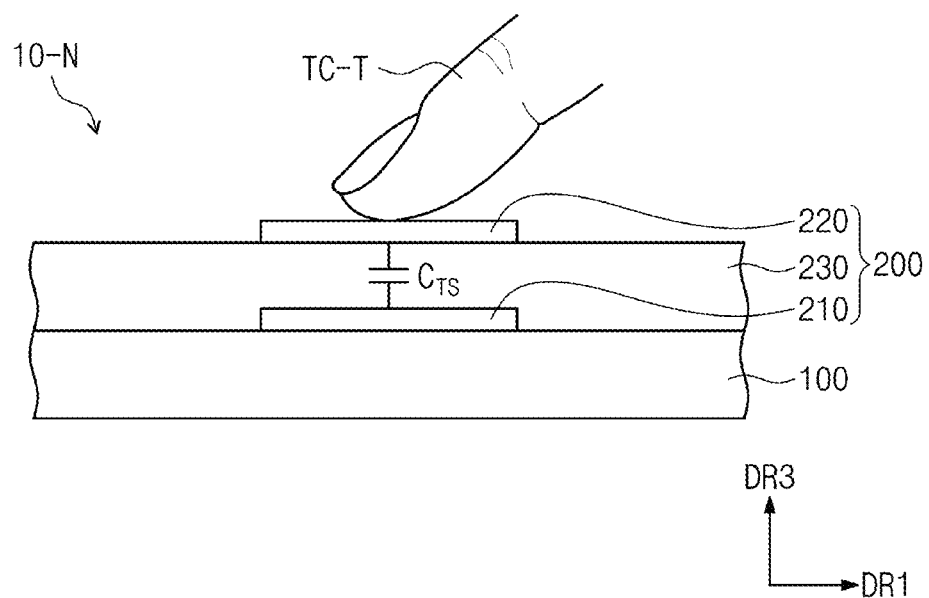
FIG. 4A, FIG. 4B and FIG. 4C are partial cross-sectional views of the electronic device according to an exemplary embodiment.
Figure 4B:
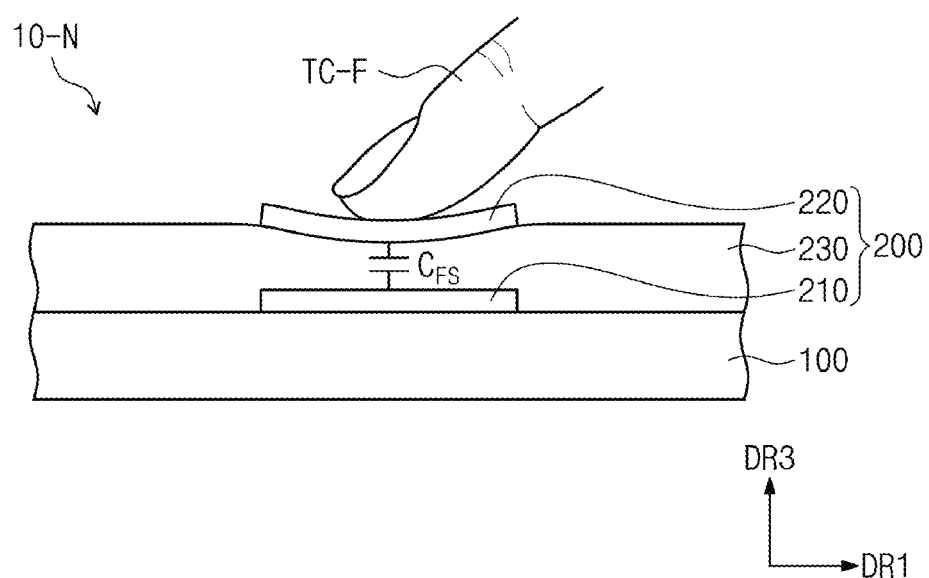
Figure 4C:
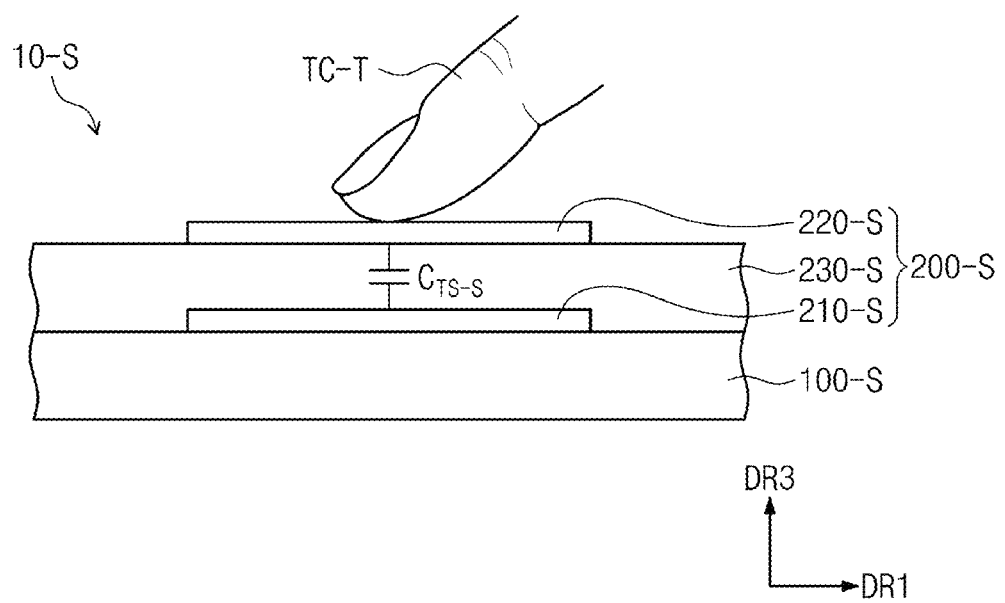

FIG. 4A to FIG. 4C are partial cross-sectional views of the electronic device according to an exemplary embodiment. FIG. 4A illustrates a normal mode electronic device 10-N applied a first touch TC-T, FIG. 4B illustrates a normal mode electronic device 10-N applied a second touch TC-F, and FIG. 4C illustrates a strain mode electronic device 10-S applied a first touch TC-T.

Hereinafter, an electronic device according to the present exemplary embodiment will be described with reference to FIG. 3A and FIG. 3B. In the meantime, the same reference numerals will be assigned to the same components described in FIGS. 1 to 3B, and detailed description will be omitted.

Referring to FIG. 4A, a predetermined capacitance $C_{TS}$ may be formed in the sensor 200 when a first touch TC-T is applied to a normal mode electronic device 10-N. The first touch TC-T may include a contact touch and a near touch for the sensor 200. When the first touch TC-T is a contact touch, the first touch TC-T may have intensity in which a shape of the sensor 200 is not deformed.

The sensor 200 may detect whether the first touch TC-T is provided through the capacitance $C_{TS}$ by the first touch TC-T. An electric signal generated from the sensor 200 may include location information of the first touch TC-T.

Referring to FIG. 4B, a predetermined capacitance $C_{FS}$ may be formed in the sensor 200 when a second touch TC-F is applied to a normal mode electronic device 10-N. The second touch TC-F may include a contact touch for the sensor 200.

The intensity of the second touch TC-F might deform the shape of the sensor 200. Thus, at least one of the shapes of the first electrode 210, the second electrode 220, and the dielectric layer 230 may be deformed by the second touch TC-F.

The sensor 200 can detect the intensity of the second touch TC-T through the capacitance $C_{TS}$ by the second touch TC-T. An electric signal generated from the sensor 200 may include force information of the second touch TC-F.

An electronic device according to an exemplary embodiment of this disclosure can detect all of the location and intensity of touch by way of one sensor 200. Accordingly, even though there is no separate pressure sensor, various touch information can be detected, so that it is possible to provide the electronic device with a slim and simplified structure.

Referring to FIG. 4C, when a first touch TC-T is provided to a strain mode electronic device 10-S, a predetermined capacitance $C_{TS-S}$ is able to be formed in a strain mode sensor layer 200-S. When the first touch TC-T is the same as the first touch TC-T provided to the normal mode sensor 200, a capacitance $C_{TS-S}$ formed in the strain mode sensor layer 200-S may be substantially the same as the capacitance $C_{TS}$ formed in the normal mode sensor 200.

As described above, a thickness and a sensing area of each sensor 200 are uniformly maintained regardless of the external force, or can be controlled to maintain a basic capacitance even though the thickness and the sensing area are changed. So, the electronic device has a uniform touch sensitivity even the shape of the electronic device is changed, and can provide a stable touch sensing environment to a user even when a shape is deformed by the external force.

Figure 5A:
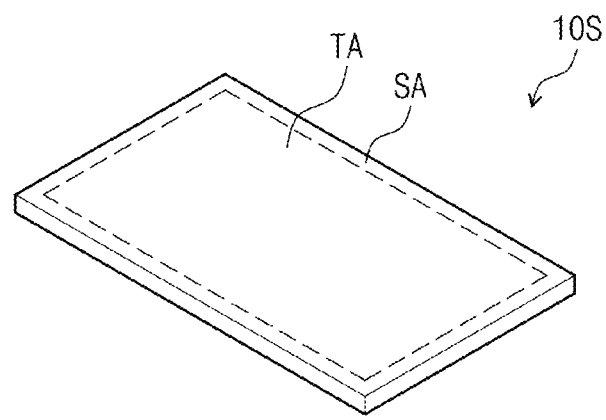
FIG. 5A, FIG. 5B and FIG. 5C are perspective views showing the electronic device according to an exemplary embodiment.
Figure 5B:
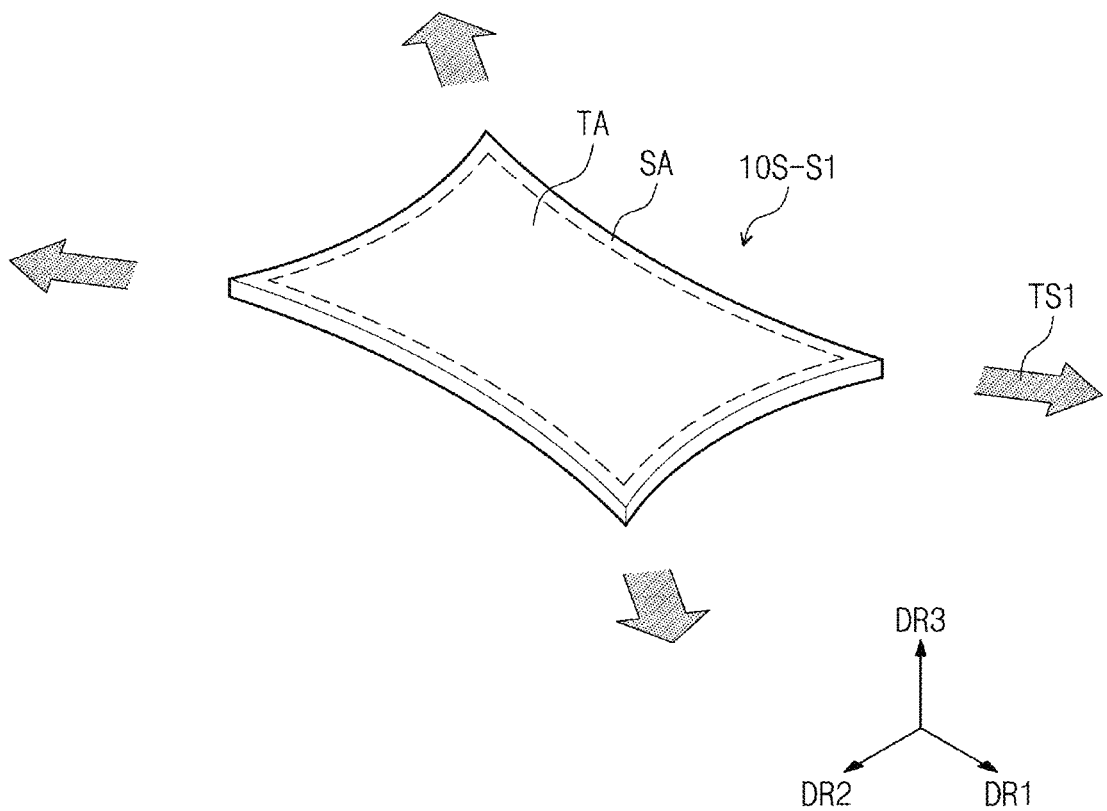
Figure 5C:
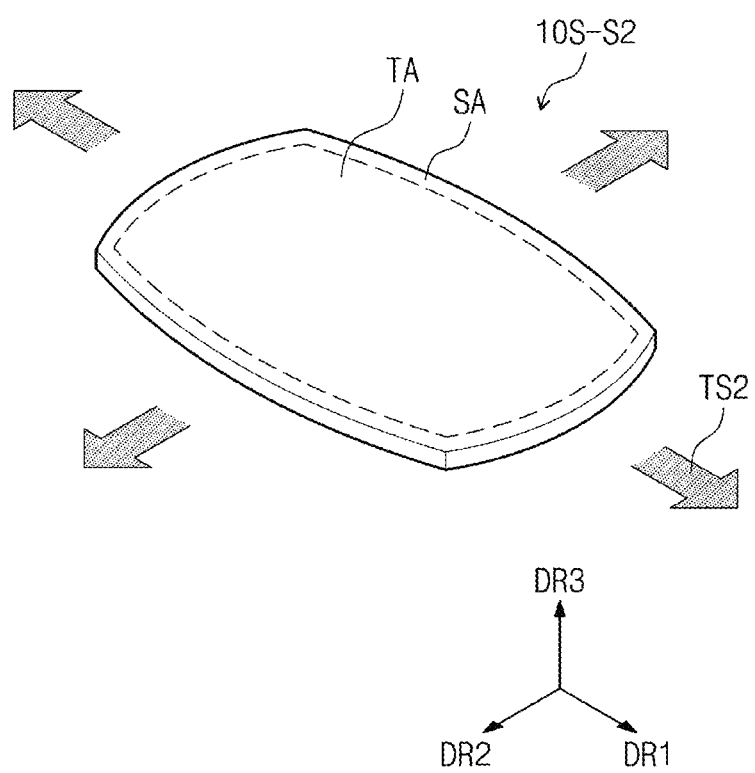

FIG. 5A to FIG. 5C are perspective views showing the electronic device according to an exemplary embodiment. FIG. 5A illustrates a normal mode electronic device 10S, FIG. 5B illustrates a strain mode first electronic device 10S-S1, and FIG. 5C illustrates a strain mode second electronic device 10S-S2.

As shown in FIG. 5A, an electronic device 10S may have a thickness defined by the third direction DR3 in a tetragonal plate shape defined by the first direction DR1 and the second direction DR2. The shape projected of the electronic device 10S may be a tetragonal shape defined by two sides facing each other, one side extending along the first direction DR1 and the other side extending along the second direction DR2.

The electronic device 10S may be varied to diverse shapes depending on the location and direction applied from the external force.

As described in FIG. 5B, a first strain mode electronic device 10S-S1 may have an elongated shape in which the apexes of the normal mode electronic device 10S are elongated. Thus, a projected shape of the first strain mode electronic device 10S-S1 may be a tetragonal shape defined by convex curves toward the inside.

An external force TS1 provided to the normal electronic device 10S may be a force applied from the center of the normal mode electronic device 10S facing toward an apex of the normal mode electronic device 10S, or a force applied toward a diagonal direction of the first direction DR1 and the second direction DR2.

As shown in FIG. 5C, a second strain mode electronic device 10S-S2 may have an elongated shape in which corners of the normal mode electronic device 10S are extended. Thus, a projected shape of the second strain mode electronic device 10S-S2 may be a tetragonal shape defined by convex curves toward the outside.

An external force TS2 provided to the normal mode electronic device 10S may be a force applied from a center of the normal mode electronic device 10S facing toward sides of the normal mode electronic device 10S, or a force applied toward a corresponding direction of the first direction DR1 or the second direction DR2.

The electronic device may be varied to various shapes in a strain mode depending on the shape of the normal mode electronic device and a force intensity or direction applied in strain mode. Since the electronic device includes elasticity, the electronic device may be changed its shape due to the external force and has improved reliability for the external force.

Figure 6A:
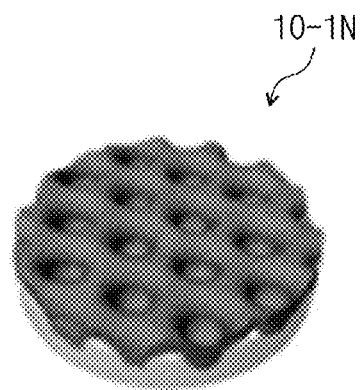
FIG. 6A, FIG. 6B and FIG. 6B are perspective views of the electronic device according to an exemplary embodiment.
Figure 6B:
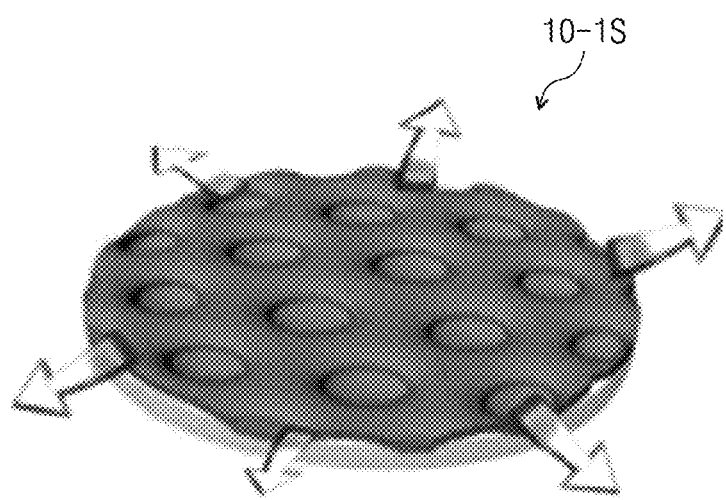
Figure 7A:
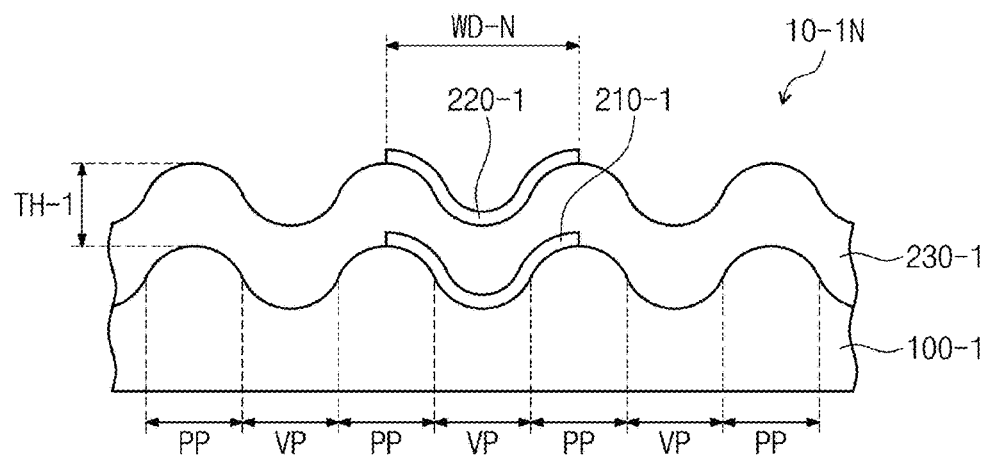
FIG. 7A is a partial cross-sectional view showing the electronic device shown in FIG. 6A.
Figure 7B:
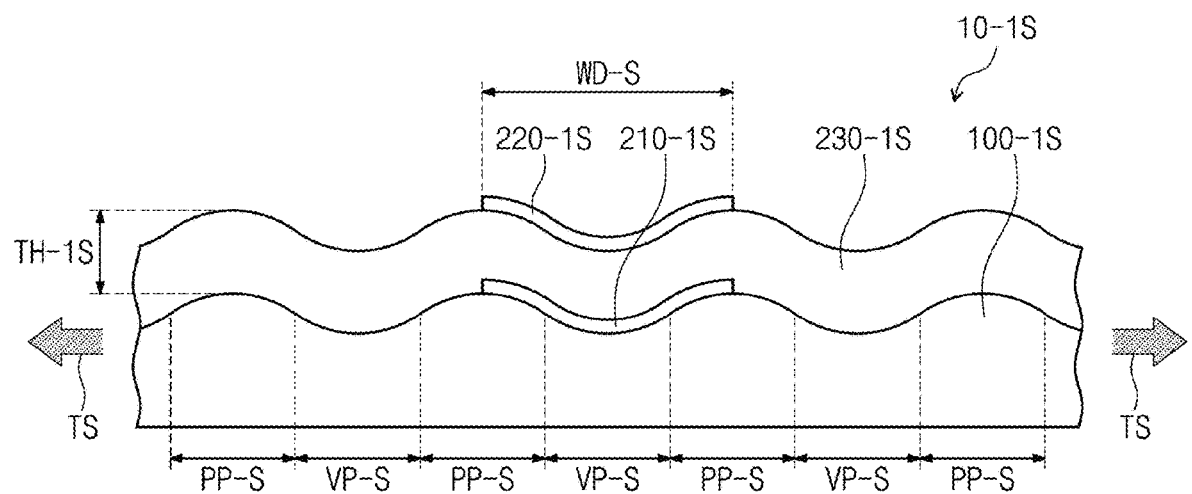
FIG. 7B is a partial cross-sectional view showing the electronic device shown in FIG. 6B.

FIG. 6A to FIG. 6B are perspective views of the electronic device according to an exemplary embodiment. FIG. 7A is a partial cross-sectional view showing the electronic device shown in FIG. 6A. FIG. 7B is a partial cross-sectional view showing the electronic device shown in FIG. 6B.

Figure 7C:
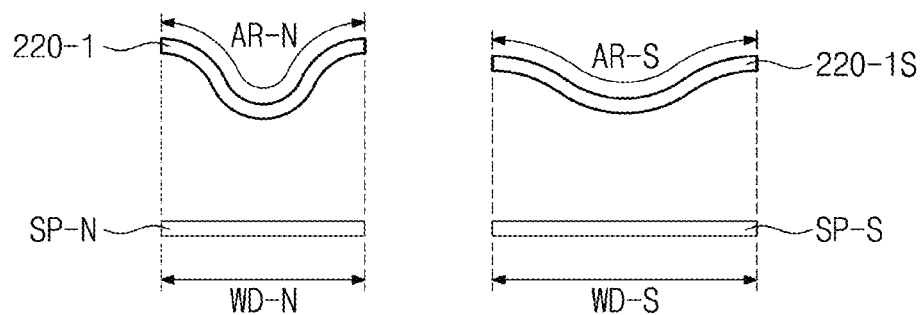
FIG. 7C is a schematic cross-sectional view showing some configurations shown in FIG. 7A and FIG. 7B.
Figure 8A:
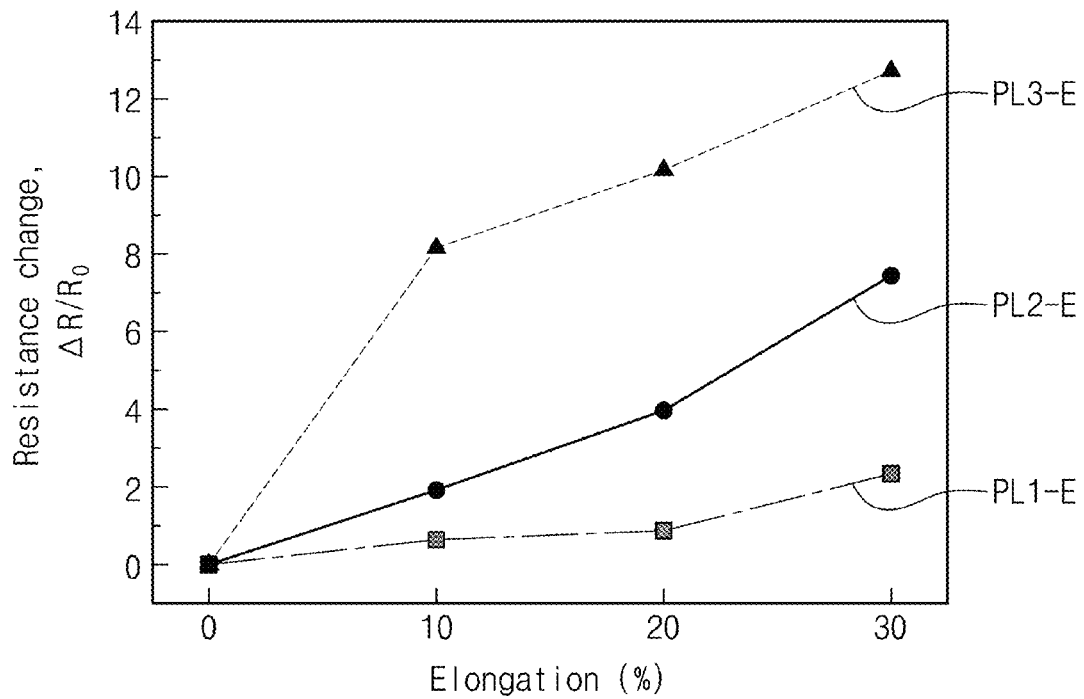
FIG. 8A is a graph showing a resistance change over an elongation of a comparison embodiment.
Figure 8B:
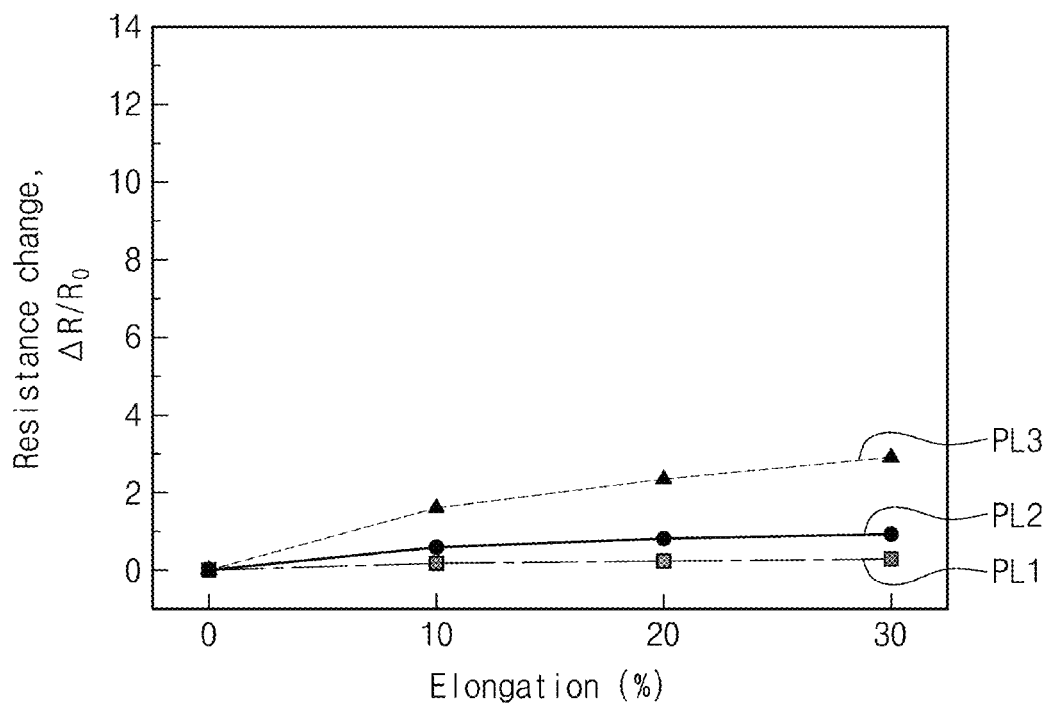
FIG. 8B is a graph showing a resistance change over an elongation of an exemplary embodiment.

FIG. 7C is a schematic cross-sectional view showing some configurations shown in FIG. 7A and FIG. 7B. FIG. 8A is a graph showing a resistance change over an elongation of a comparison embodiment. FIG. 8B is a graph showing a resistance change over an elongation of an exemplary embodiment.

FIG. 6A illustrates a normal mode electronic device 10-1N, and FIG. 6B illustrates a strain mode electronic device 10-1S. Hereinafter, the electronic device according to the present exemplary embodiment will be described with reference to FIG. 6A and FIG. 8B.

As shown in FIG. 6A and FIG. 7A, the upper surface of the normal mode electronic device 10-N may include a plurality of concave portions and convex portions. The concave portions and convex portions may include plural peaks and plural valleys.

Each of the plural peaks is protruded upward, and each of the valleys is depressed downward. The plural peaks and valleys may be alternately arranged. One peak can be encompassed by six peaks, and one valley can be encompassed by six valleys.

Referring to FIG. 7A, the normal mode electronic device 10-N includes a base substrate 100-1, a first electrode 210-1, a second electrode 220-1, and a dielectric layer 230-1. The upper surface of the base substrate 100-1 includes a plurality of concave portions and convex portions.

The base substrate 100-1 includes a plurality of peak intervals PP and a plurality of valley intervals VP. The plurality of concave portions and convex portions may be defined by the plurality of peak intervals PP and valley intervals VP.

The plurality of valley intervals PP in the base substrate 100-1 may include relatively thick thickness, and the plurality of valley intervals VP may include relatively thin thickness. The concave portions and convex portions formed on the upper surface of the normal mode electronic device 10-1N may be formed substantially by reflecting the concave portions and convex portions of the base substrate 100-1. A lower surface of the base substrate 100-1 may be flat surface.

The first electrode 210-1 may be provided on the upper surface of the base substrate 100-1. The first electrode 210-1 may include a plurality of patterns, each pattern overlapping one peak section and two valley intervals. FIG. 7A and FIG. 7B exemplarily illustrate one pattern. This is shown as an example, and each of the first electrodes 210-1 may include patterns of diverse shapes, but it is not limited to any one particular exemplary embodiment.

The second electrode 220-1 may be disposed on the first electrode 210-1. In this exemplary embodiment, the second electrode 220-1 is disposed on the place overlapped with the first electrode 210-1 in the plane, and is illustrated with the patterns having the same shape as the first electrode 210-1.

The dielectric layer 230-1 may be provided between the first electrode 210-1 and the second electrode 220-1. The dielectric layer 230-1 may be formed to contact with the upper surface of the first electrode 210-1, or may contact with the lower surface of the second electrode 220-1.

The upper surface of the dielectric layer 230-1 may reflect the upper surface of the base substrate 100-1. Thus, the upper surface of the dielectric layer 230-1 may be defined by the plurality of the concave portions and convex portions corresponding to the upper surface of the base substrate 100-1.

As shown in FIG. 7B, when the external force TS is applied, the normal mode electronic device 10-1N may become a strain mode electronic device 10-1S having a deformed shape. The strain mode electronic device 10-1S is able to get stability despite the external force TS by changing the shape depending on the external force TS.

As the external force TS is applied, the strain mode base substrate 100-1S may include a plurality of strain peak section PP-S and a plurality of strain valley intervals VP-S. The plurality of strain peak intervals PP-S and a plurality of strain valley intervals VP-S may be elongated portions which are extended along the direction of the external force TS from a plurality of peak intervals PP and a plurality of strain valley intervals VP.

The plurality of concave portions and convex portions defined by the plurality of strain peak intervals PP-S and the plurality of strain valley intervals VP-S may have a slope gentler than the concave portions and convex portions defined by the plurality of peak intervals PP and a plurality of valley intervals VP.

The concave portions and convex portions may be a mogul shape. This is just an example, and the concave portions and convex portions may have various shapes.

For example, the plurality of concave portions and convex portions may include a plurality of pyramid shapes, pillar shapes, or porous shapes. The base substrate 100-1 may have an upper surface including the plurality of concave portions and convex portions by way of the various shapes, but it is not limited to any one particular exemplary embodiment.

A thickness of each of the strain mode peak intervals PP-S is thinner than the thickness of each of the peak intervals PP, and a thickness of each of the strain mode valley intervals VP-S is thicker than the thickness of each of the valley intervals VP. Accordingly, a projected area of the strain mode electronic device 10-1S may be greater than the projected area of the normal mode electronic device 10-1N.

A strain mode dielectric layer 230-1S may be elongated along the direction in which the external force TS is applied by reflecting the shape of the strain mode base substrate 100-1S. Accordingly, the projected area of the strain mode dielectric layer 230-1S may be greater than the projected area of the normal mode dielectric layer 230.

A thickness TH-1S of the strain mode dielectric layer 230-1S may be substantially the same as the thickness TH-1 of the normal mode dielectric layer 230. In the electronic device 10-1, the thickness of the dielectric layer 230 may not be changed even though the external force TS is applied, namely zero thickness change.

The base substrate 100-1 resolves the stress due to the external force TS through the curvature change of the concave portions and convex portions so that there is no need to change the upper surface area of the base substrate 100-1 for the external force TS. Because there is no actual change in the upper surface area of the base substrate 100-1, the lower surface area of the dielectric layer 230-1S disposed on the upper surface of the base substrate 100-1 may also not be changed.

The lower surface and the upper surface of the dielectric layer 230-1 reflect the upper surface of the base substrate 100-1. The lower surface of the dielectric layer 230-1 may include the same shape as the upper surface of the dielectric layer 230-1. A shape change in the upper surface of the base substrate 100-1 is mirrored not only to the lower surface, but also to the upper surface of the dielectric layer 230-1.

Each of the area of the lower and upper surface of the strain mode dielectric layer 230-1S may be substantially the same as the area of the dielectric layer 230 of the normal mode. A thickness TH1-S of the strain mode dielectric layer 230-1S may be substantially the same as the thickness TH-1 of the normal mode dielectric layer 230-1. The dielectric layer 230-1 may stably respond to the shape change of the base substrate 100-1 without thickness change.

Thus, although the area projected to the plane of the strain mode dielectric layer 230-1S may be larger than the area projected to the plane of the normal mode dielectric layer 230-1, the volume of the strain mode dielectric layer 230-1S may be substantially the same as the volume of the normal mode dielectric layer 230-1.

Referring to FIG. 7C, a normal mode second electrode 220-1 has different shape from a strain mode second electrode 220-1S. The normal mode second electrode 220-1 is mirrored to a first shape SP-N, and the strain mode second electrode 220-1S is mirrored to a second shape SP-S.

The first shape SP-N and the second shape SP-S have different widths WD-N, WD-S. Thus, the first shape SP-N and the second shape SP-S may have different areas. Namely, an area in the plan view of the normal mode second electrode 220-1 becomes different from the area in the plan view of the strain mode second electrode 220-1S.

In this example, the upper surface area AR-S itself of the strain mode second electrode 220-1S may be substantially the same as the upper surface area AR-N itself of the normal mode second electrode 220-1. Since the strain mode second electrode 220-1S is changed to have a gradual curve due to the external force TS, the area or thickness of the upper surface of the normal mode second electrode 220-1 is not changed.

That is, although the second electrode 220-1 changes its shape, only area in the plan view is changed, and the upper surface area itself is not changed. Factors substantially affecting forming capacitance for touch sensing may be the area of upper surface itself and the thickness of the dielectric layer 230-1.

FIG. 8A and FIG. 8B illustrate a resistance change $\Delta R/R_0$ according to elongation deformation (%) of comparative embodiments and the present disclosure. In FIG. 8A, a first comparative graph PL1-E, a second comparative graph PL2-E, and a third comparative graph PL3-E illustrate a resistance change according to elasticity of the electrode layer formed with a conducting polymer having different mixing rate. The comparative embodiment includes a base substrate and a dielectric layer changing their thickness due to the elongation and contraction.

In FIG. 8B, a first graph PL1, a second graph PL2, and a third graph PL3 illustrate a resistance change according to elasticity of the electrode layer formed with a conducting polymer having different mixing rate. The first graph PL1 illustrates a resistance change of the electrode layer corresponding to the electrode layer of the first comparative graph PL1-E, the second graph PL1 illustrates a resistance change of the electrode layer corresponding to the electrode layer of the second comparative graph PL2-E, and the third graph PL3 illustrates a resistance change of the electrode layer corresponding to the electrode layer of the third comparative graph PL3-E.

Exemplary embodiments according to the FIG. 8B may include a base substrate 100-1. The dielectric layer may be deformed in shape, but its thickness may not be changed. Hereinafter, the resistance change of the electrode layer according to the present exemplary embodiment will be described with reference to FIG. 8A and FIG. 8B.

As shown in FIG. 8A and FIG. 8B, when graphs of the corresponding electrode layers are compared with each other, a resistance change $\Delta R/R_0$ of the electrode layers shows relatively low comparing to the same elongation percentage. Specifically, the first graph PL1 has a lower resistance change than the first comparative graph PL1-E in a deformed state being more than about 20% or more, and the second graph PL1 and the third graph PL3 has a lower resistance change than the second comparative graph PL2-E and the third comparative graph PL3-E in a deformed state being more than about 10% or more. The third graph PL3 compared with the third comparative graph PL3-E shows a big difference in resistance change at the beginning state when the deformation is occurred.

Referring to FIG. 8B, a resistance change in the electrode layers is relatively normal. The first to third graphs PL1, PL2, PL3 show a resistance change of lower than about 3 or less in 30% deformation. In the present exemplary embodiment, as the electronic device provides the base substrate 100-1 of gradual curve shape with electrode layers, the electronic device can provide electrically stable touch environment even in a strain mode. Accordingly, it is possible to provide the electronic device capable of stable sensing the external touch and having stable sensitivity even when its shape is deformed.

Referring to FIG. 7A and FIG. 7B, a thickness TH-1S of the strain mode dielectric layer 230-1S is substantially the same as the thickness TH-1 of the normal mode, and a upper surface area AR-S itself of the strain mode second electrode 220-1S is substantially the same as the area AR-N of the normal mode. Accordingly, it is possible to provide a user with a stable touch environment because the electronic device 10-1 can maintain uniform touch sensitivity even the shape is deformed by the external force TS.

Figure 9A:
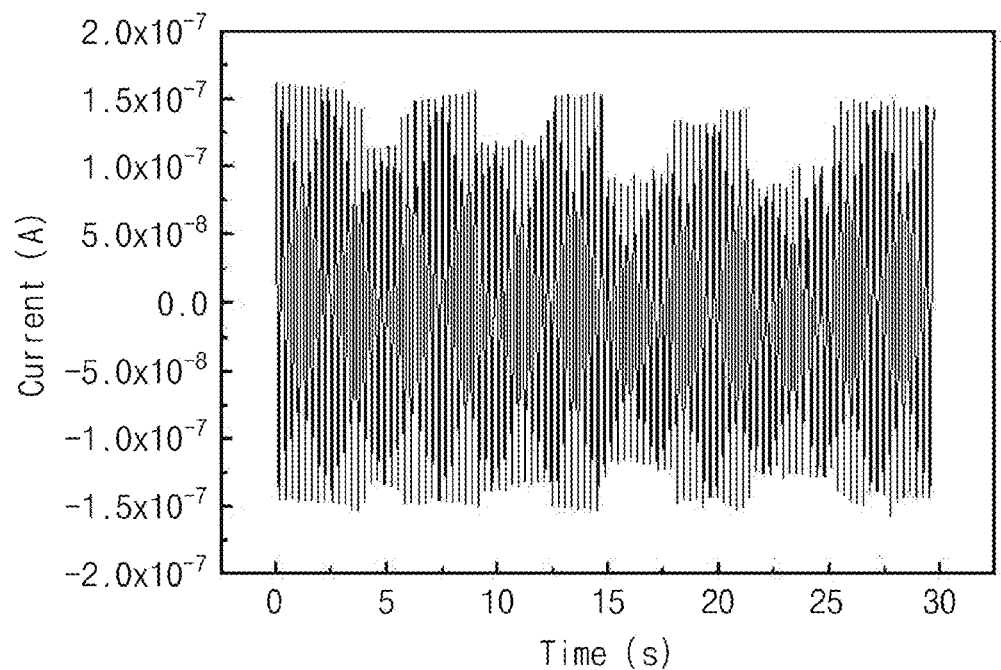
FIG. 9A is a graph showing a current change over a time change of the electronic device according to an exemplary embodiment.
Figure 9B:
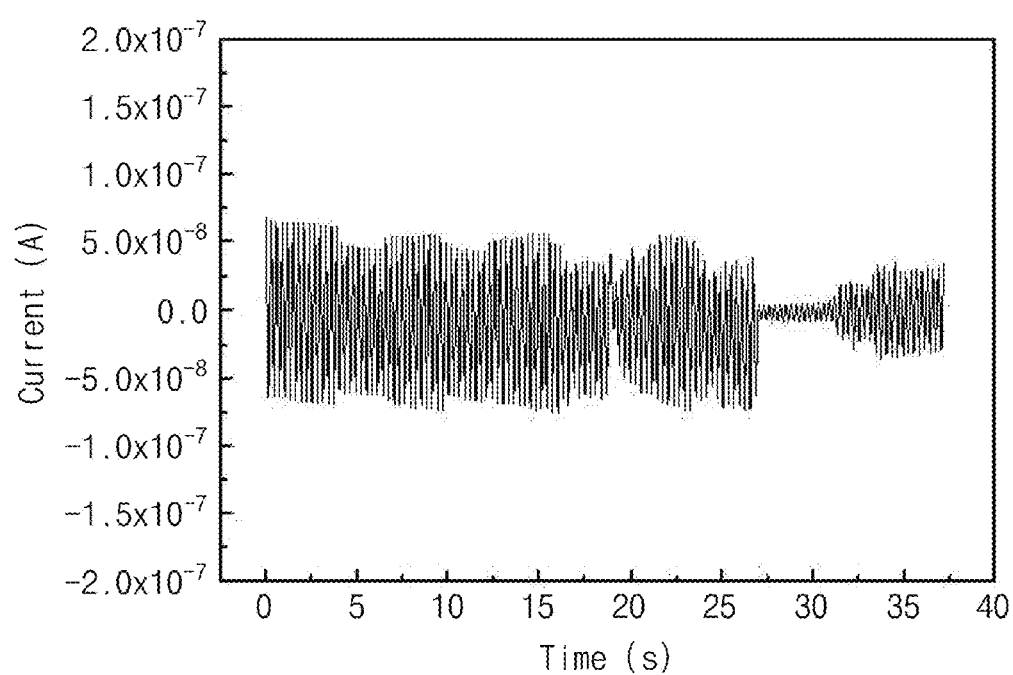
FIG. 9B is a graph showing current change over a time change of the electronic device according to an exemplary embodiment.

FIG. 9A is a graph showing a current change over a time change of the electronic device according to an exemplary embodiment. FIG. 9B is a graph showing current change over a time change of the electronic device according to an exemplary embodiment.

FIG. 9A and FIG. 9B depicts touch sensing plots of electronic devices 10-1N, 10-1S shown in FIG. 7A and FIG. 7B depending on modes. FIG. 9A is a graph showing a current change over the time of the normal mode electronic device 10-1N according to an exemplary embodiment, and FIG. 9B is a graph showing a current change over the time of the strain mode electronic device 10-1S according to an exemplary embodiment.

FIG. 9A and FIG. 9B show a section TS in which the first touch is input and a section FS in which the second touch is input. The first touch corresponds to the first TC-T shown in FIG. 4A and FIG. 4C, and the second touch corresponds to the second touch TC-F shown in FIG. 4B.

As shown in FIG. 9A, as the time passes, a plurality of intervals which have lower current amplitude than the adjacent intervals appeared. In the comparative embodiment, a first touch is applied at points of about 5 seconds and about 10 seconds, which are before 15 seconds, and a second touch is applied at points of about 15 seconds and about 23 seconds, which are after 15 seconds.

As the first touch and the second touch are applied, a current change occurred. Therefore, the comparative embodiment can sense the first touch or the second touch by identifying the change of current amplitude.

Meanwhile, the current amplitude change after 15 seconds in which the second touch is applied may appear smaller than the current amplitude change before 15 seconds in which the first touch is applied. Therefore, a contact touch including location information and a pressure touch including intensity information may be identified.

As shown in FIG. 9B, the first touch and the second touch are separately applied two times in which the first touch is applied at about 5 seconds and 10 seconds (before 15 seconds), and the second touch is applied at about 16 seconds and about 26 seconds (after 15 seconds). Referring to FIG. 9B, a current change amplitude occurred in the strain mode electronic device 10-1S may appear relatively smaller than a current change amplitude occurred in the normal mode electronic device 10-1N. However, as shown at the points of about 16 seconds and about 26 seconds, the current change amplitude of the section in which the second touch is applied is also relatively smaller than the normal mode.

The electronic device 10-1 according to an exemplary embodiment of this disclosure may easily sense a pressure touch besides a contact touch even in an elongated state. The electronic device 10-1 according to an exemplary embodiment of this disclosure may provide a stable touch sensitivity environment depending on elongation state. Accordingly, a user can stably control the electronic device through the touch without affecting the shape change of the electronic device 10-1.

Figure 10A:
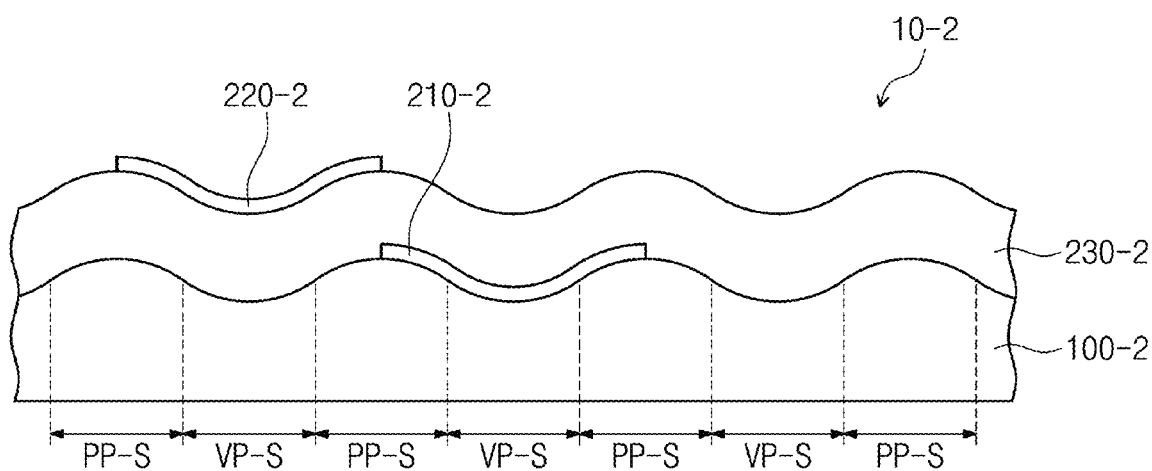
FIG. 10A is a partial cross-sectional view of the electronic device according to an exemplary embodiment.
Figure 10B:
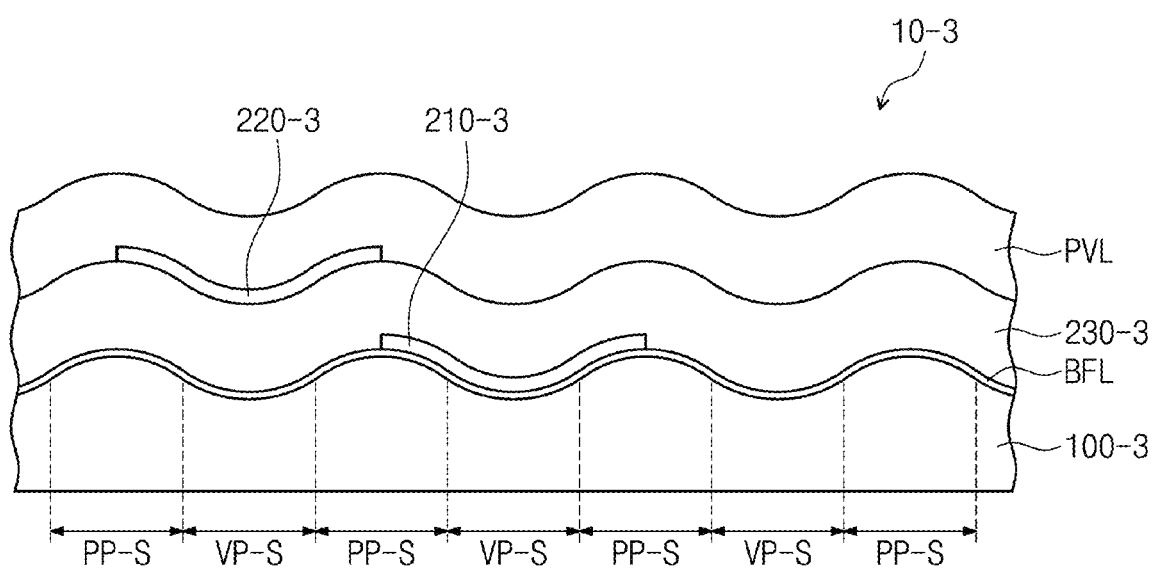
FIG. 10B is a partial cross-sectional view of the electronic device according to another exemplary embodiment.

FIG. 10A is a partial cross-sectional view of the electronic device according to an exemplary embodiment. FIG. 10B is a partial cross-sectional view of the electronic device according to another exemplary embodiment.

Hereinafter, the electronic device according to the present exemplary embodiment will be described with reference to FIG. 10A and FIG. 10B.

As shown in FIG. 10A, the electronic device 10-2 may include a base substrate 100-2, a first electrode 210-2, a second electrode 220-2, and a dielectric layer 230-2. The base substrate 100-2 and the dielectric layer 230-2 may correspond to the base substrate 100-1 and the dielectric layer 230-1, respectively. A repeated descriptions like above will be omitted. The first electrode 210-2 and the second 220-2 may be provided not to overlap each other. The electronic device 10-2 may sense the touch applied from the outside through the capacitance change which is formed by the first electrode 210-2, the second electrode 220-2, and the dielectric layer 230-2 which are alternately arranged.

As shown in FIG. 10B, the electronic device 10-3 may further include a buffer layer BFL and a protection layer PVL. The buffer layer BFL may be arranged between the base substrate 100-3 and the dielectric layer 230-3. The first electrode 210-3 may be arranged on the buffer layer BFL.

The buffer layer BFL covers the upper surface of the base substrate 100-3. The buffer layer BFL may include a metal oxide such as an aluminum oxide.

The buffer layer BFL changes an upper surface characteristic of the base substrate 100-3. Accordingly, the first electrode 210-3 may be stably formed on the base substrate 100-3 through the buffer layer BFL.

The protection layer PVL may be arranged on the dielectric layer 230-3. The protection layer PVL covers the second electrode 220-3. The protection layer PVL electrically insulates and protects the sensor layer from the outside.

The protection layer PVL includes an insulation material. The protection layer PVL may include an insulation material with elasticity. For example, the protection layer PVL may include one or more material selected from the group consisting of polydimethylsiloxane PDMS, Ecoflex, and polyurethane PU which have elasticity.

The protection layer PVL may include a dielectric material. For example, the protection layer PVL may include a mixture in which oxide particles are diffused in the elastic material. Thus, the protection layer PVL may be formed as a functional layer which has elasticity and is easy to control permittivity. This is shown as an example, and the electronic device according to one exemplary embodiment may include multilayer formations besides electrodes formed by various arrangements.

Figure 11A:
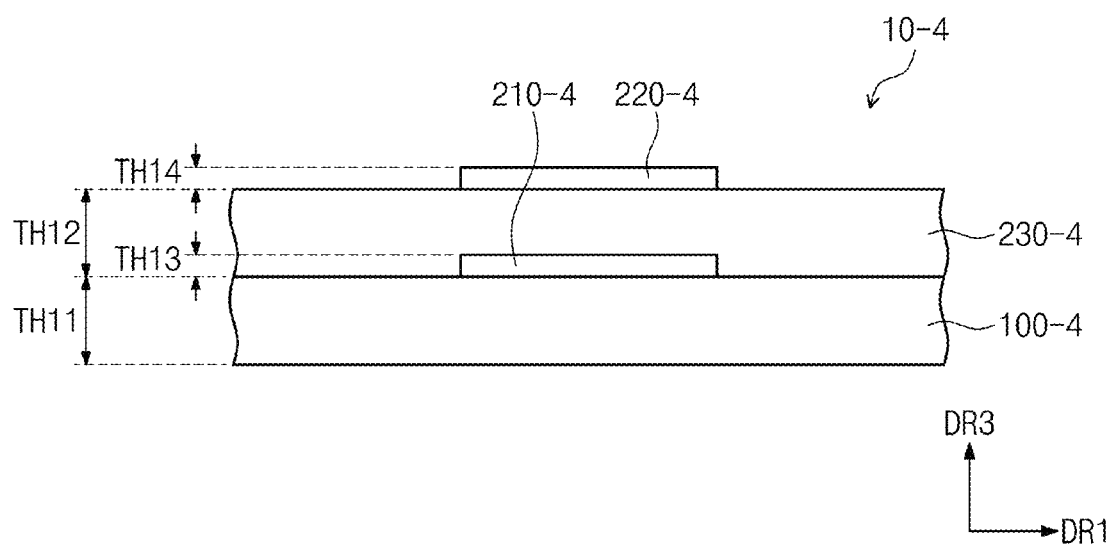
FIG. 11A is a partial cross-sectional view of the electronic device according to the other exemplary embodiment.
Figure 11B:
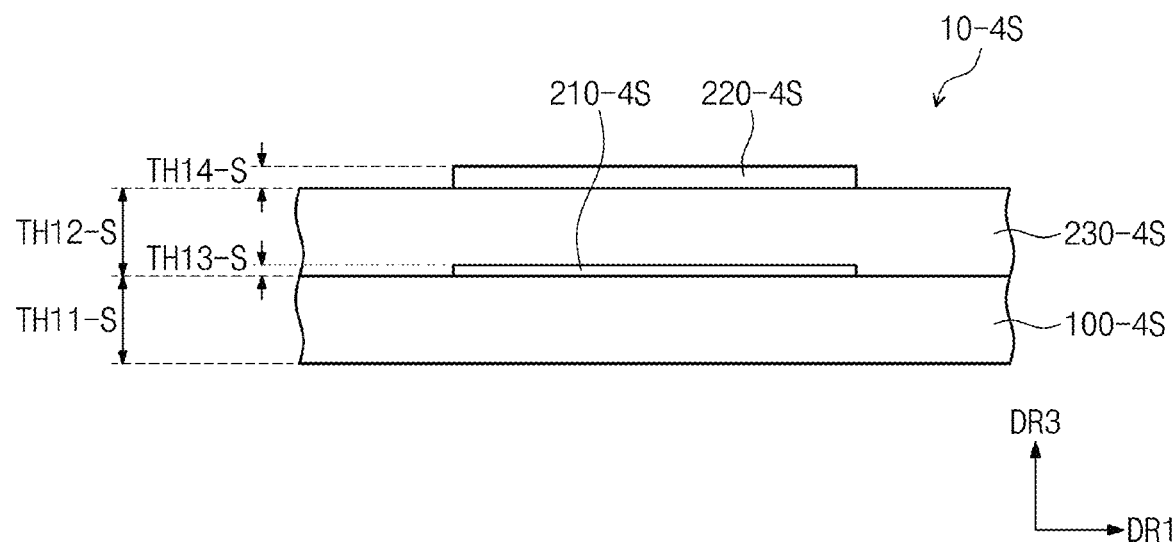
FIG. 11B is a partial cross-sectional view of the electronic device according to the other exemplary embodiment.

FIG. 11A is a partial cross-sectional view of the electronic device according to another exemplary embodiment. FIG. 11B is a partial cross-sectional view of the electronic device according to another exemplary embodiment. FIG. 11B illustrates a state of a strain mode electronic device shown in FIG. 11A.

FIG. 11B may include the same configurations as the electronic device 10-4 shown in FIG. 11A, except the elongated state extended by the external force which is applied to the parallel direction to the first direction DR1. Hereinafter, the electronic device according to the present exemplary embodiment will be described with reference to FIG. 11A and FIG. 11B.

As shown in FIG. 11A, the electronic device 10-4 may include a base substrate 100-4, a first electrode 210-4, a dielectric layer 230-4, and a second electrode 220-4. The base substrate 100-4 may include a first thickness TH11, the dielectric layer 230-4 may include a second thickness TH12, the first electrode 210-4 may include a third thickness TH13, and the second electrode 220-4 may include a fourth thickness TH14.

The base substrate 100-4 may be transformed to the strain mode base substrate 100-S by the external force. A thickness TH11-S of the strain mode base substrate 100-S may be different from the thickness TH11 of the normal mode base substrate 100-4.

The base substrate 100-4 is substantially the same as the base substrate 100 shown in FIG. 3A, and the base substrate 100-S is substantially the same as the base substrate 100-S shown in FIG. 3B. Accordingly, repeated descriptions above will be omitted.

The dielectric layer 230-4 may be transformed to the strain mode dielectric layer 230-4S by the external force. A thickness TH12-S of the strain mode dielectric layer 230-4S may be substantially the same as the thickness TH2 of the normal mode dielectric layer 230-4.

The second electrode 220-4 may be transformed to the strain mode second electrode 220-4S by the external force. A difference between a thickness TH14-S of the strain mode second electrode 220-4S and a thickness TH4 of the normal mode second electrode 220-4 with no external force is absent or very small.

The first electrode 210-4 may be transformed to the strain mode first electrode 210-4S by the external force. A thickness TH13-S of the strain mode first electrode 210-4S and a thickness TH13 of the normal mode first electrode 210-4 with no external force may be different.

The first electrode 210-4 is arranged relatively close to the upper surface of the base substrate 100-4 as compared with the second electrode 220-4. Accordingly, the first electrode 210-4 may be relatively heavily affected by the change of the upper surface of the base substrate 100-4 as compared with the second electrode 220-4.

The electronic device 10-4 includes a first electrode 210-4 which is a material with high sensitive for the strain so that the device can easily sense the strain change of the electronic device 10-4. It is possible to provide location information and intensity information of the external touch and to realize a multi-functional sensor capable of sensing a deformation degree of the electronic device 10-4 due to the external force.

As shown in FIG. 11B, the strain mode electronic device 10-4S may have an elongated shape extended from the electronic device 10-4 shown in FIG. 11A. The strain mode electronic device 10-4S may include a strain mode base substrate 100-4S, a strain mode first electrode 210-4S, a strain mode second electrode 220-4S, and a strain mode dielectric layer 230-4S.

The strain mode base substrate 100-4S may have a strain mode first thickness TH11-S, a strain mode dielectric layer 230-4S may have a strain mode second thickness TH12-S, a strain mode first electrode 210-4S may have strain mode third thickness TH13-S, and the strain mode second electrode 220-4S may have fourth thickness TH14-S.

In this example, the first electrode 210-4 may have a different elastic sensitivity from the second electrode 220-4. For example, the first electrode 210-4 may have a different resistance change from the second electrode 220-4 for the same elastic deformation.

More specifically, the first electrode 210-4 may have a different elastic sensitivity from the second electrode 220-4. In this exemplary embodiment, the first electrode 210-4 may have lower elastic sensitivity than the second electrode 220-4. For example, for the same external force, the fourth thickness TH14 is substantially the same as the strain mode fourth thickness TH14-S, and the third thickness TH13 is different from the strain mode third thickness TH13-S.

The thickness of the first electrode 210-4 may be changed by the external force. The thickness change of the first electrode 210-4 may transform the internal resistance of the first electrode 210-4. Thus, the electronic device 10-4 according to an exemplary embodiment may sense the elongation degree of the base substrate 100-4 through the internal resistance change of the first electrode 210-4.

Specifically, when an alternating current pulse voltage applies to the second electrode 220-4 and measures a voltage of the first electrode 210-4, a changed voltage can be measured according to the resistance change of the first electrode 210-4. The changed voltage may be a factor reflecting the elongation degree of the electronic device 10-4. Thus, the electronic device 10-4 may be a functional sensor capable of sensing the elongation degree at the same time of touch sensing.

The first electrode 210-4 may include a conductive material. For example, the first electrode 210-4 may include at least one of a metallic nanoparticle, a metallic nanowire, a carbon nanotube CNT, a conducting polymer, and a composite thereof. The conducting polymer may be a polymer composite capable of conducting.

For example, the first electrode 210-4 may include a metallic nanowire/polymer composite or a transparent metallic nanoparticle/polymer composite, and Dragon Skin® such as CNT/PEDOT:PSS/PU, CNT/PU, Ag NW/PU, Ag NP/PDMS, Ag NW/PDMS, Graphene/rubber, ZnO NW/polystyrene, Polypyrrole/PU, Carbon black/PDMS, AgNW/PEDOT:PSS/PU, Graphene/AgNWs, AgNW/PU, AgNW/PDMS, SWCNT/PMMA (polymethyl methacrylate), rGO/Polyimide, CNT/Ecoflex, CBs/PDMS, ZnO NWs/PDMS, CBs/TPE, CNT/Ecoflex, CBs/Ecoflex, CNTs/silicone elastomer, Graphene/rubber, Ag NWs/Ecoflex, Platinum (Pt)/PDMS, Au NWs/PANI/rubber, Au Ws/latex rubber, ZnO-embedded paper, graphene woven fabrics, Aligned CNTs/PDMS, Graphene foam/PDMS.

Meanwhile, the first electrode 210-4 may be relatively sensitive as compared with the second electrode 220-4. Therefore, the first electrode 210-4 may have a high resistance change for the strain change as compared with the second electrode 220-4. The sensitivity for the strain change may be changed according to the electrode structure and shape, or electrode material.

For example, the first electrode 210-4 may include a material which has higher elastic sensitivity than the second electrode 220-4 among the conducting materials with elasticity.

Therefore, even though each of the first electrode 210-4 and the second electrode 220-4 of the electronic device 10-4 includes a conducting material with elasticity, it is possible to provide the electronic device capable of easily sensing the strain degree by differently designing the actual elastic sensitivity.

Figure 12A:
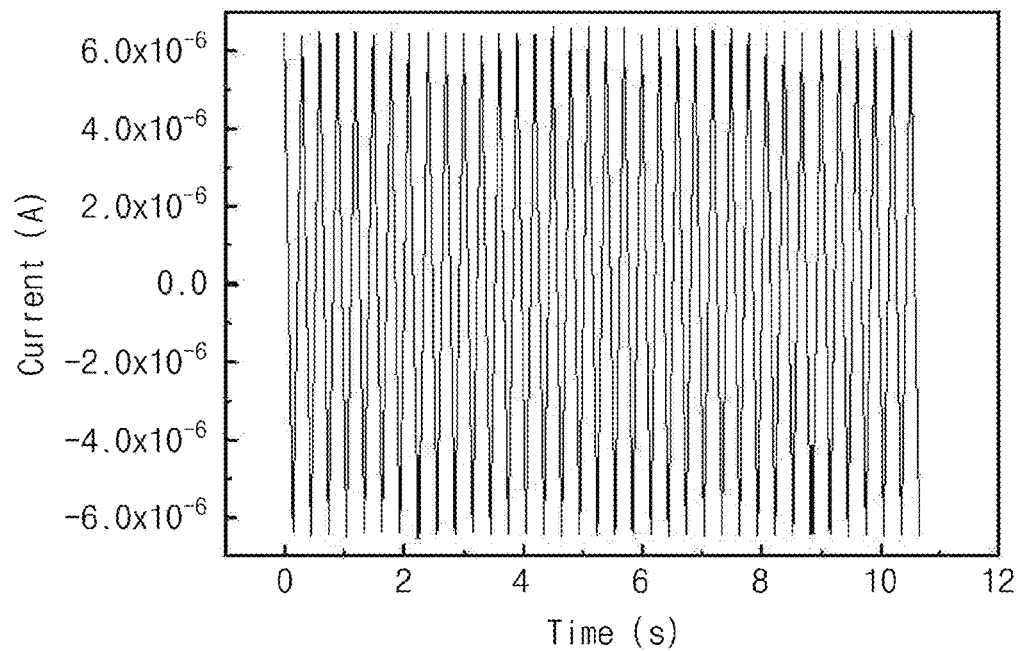
FIG. 12A, FIG. 12B, FIG. 12C and FIG. 12D are graphs showing current change over time of a first electrode according to an exemplary embodiment.
Figure 12B:
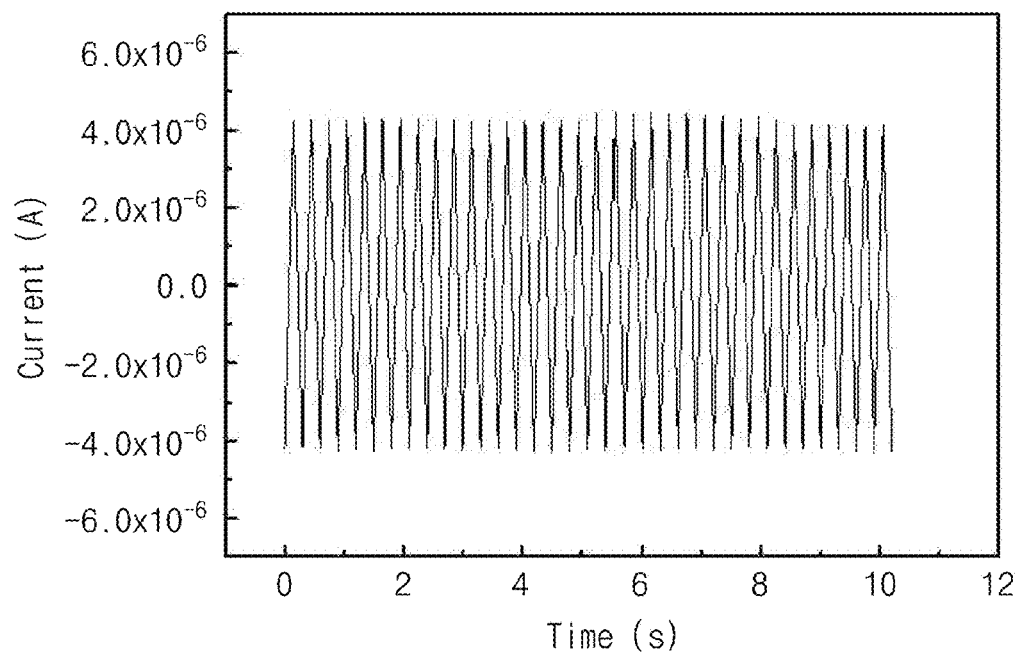
Figure 12C:
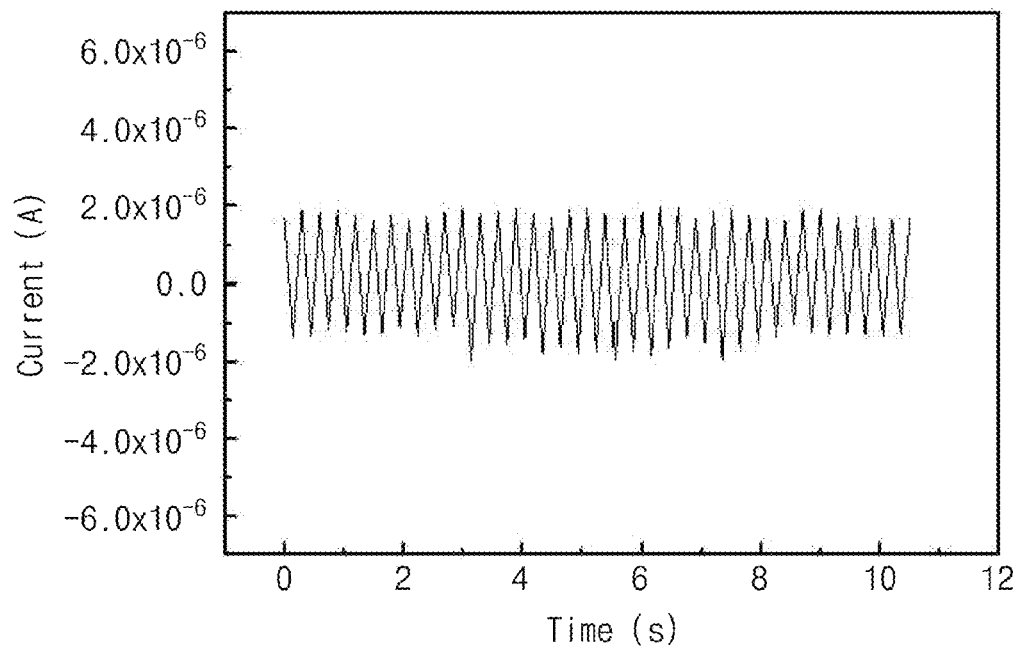
Figure 12D:
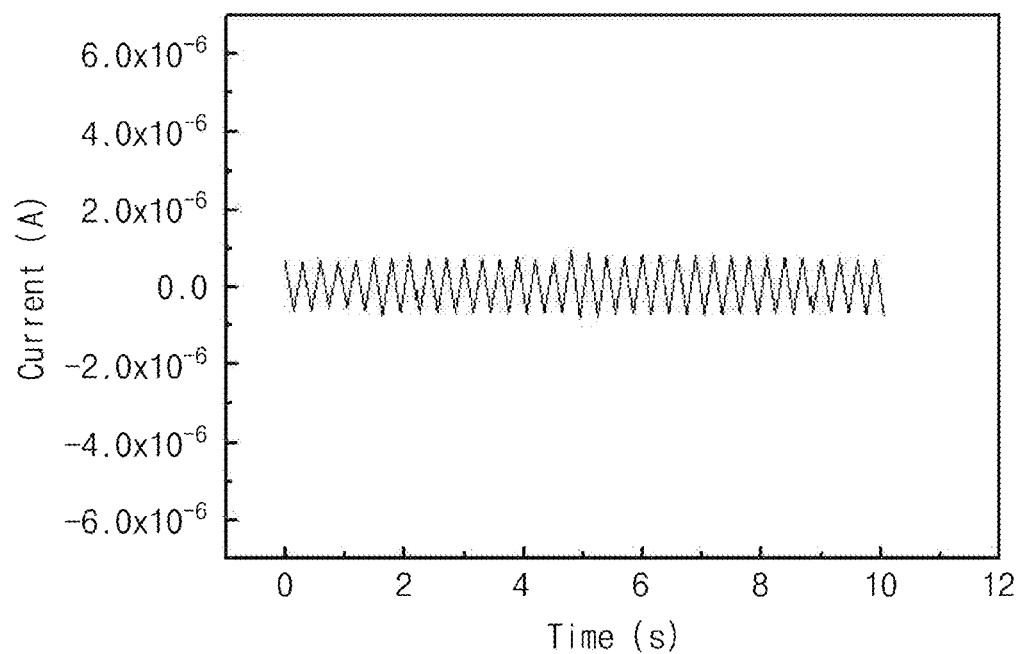

FIG. 12A to FIG. 12D are graphs showing current change over time of a first electrode according to an exemplary embodiment. FIG. 12A is current change of the normal mode first electrode (refer to 210-4 of FIG. 11A), and FIG. 12B to FIG. 12D are current changes of the strain mode first electrode (refer to 210-4S of FIG. 11B). FIG. 12A to FIG. 12D are graphs showing an elastic deformation degree which is different from one another. FIG. 12B illustrates a current change of elongated state to about 10%, FIG. 12C illustrates a current change of elongated state to about 20%, and FIG. 12D illustrates a current change of elongated state to about 30%. Hereinafter, a measurement of the elongation degree in the strain mode will be described with reference to FIG. 12A and FIG. 12B.

Referring to FIG. 12A to FIG. 12D, the first electrode 210-4S shows a flow of current change that an amplitude becomes low as the degree of deformation becomes larger.

The normal mode first electrode 210-4 shows a flow of current change in which the current has amplitude of about $\pm 6 10^{-6}$ (A), but as an elongation degree becomes bigger, the strain mode first electrode 210-4S shows a flow of current change having low amplitude.

An elongated state of about 30% which is the most big elongation degree shows amplitude change of about $\pm 1 10^{-6}$ (A) or less.

In the electronic device 10-4, by designing for the first electrode 210-4 to show sensitive resistance change according the elongation degree, the elongation degree of the electronic device 10-4 can be measured. Therefore, the electronic device 10-4 may be used for multi-functional electronic device capable of sensing all of the touch and elongation degree.

Figure 13A:
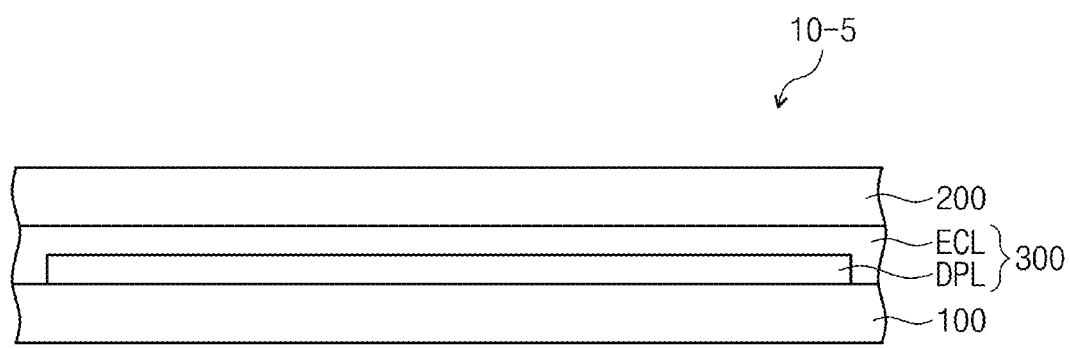
FIG. 13A is a schematic cross-sectional view of the electronic device according to an exemplary embodiment.
Figure 13B:
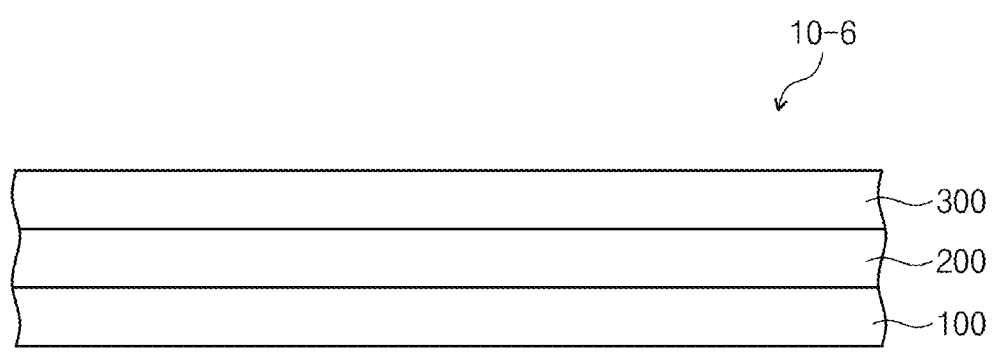
FIG. 13B is a schematic cross-sectional view of the electronic device according to an exemplary embodiment.

FIG. 13A is a schematic cross-sectional view of the electronic device according to an exemplary embodiment. FIG. 13B is a schematic cross-sectional view of the electronic device according to an exemplary embodiment. Hereinafter, the present disclosure will be explained in detail with reference to the FIG. 13A and FIG. 13B.

As shown in FIG. 13A, the electronic device 10-5 may further include a display layer 300. The display layer 300 may be arranged between the base substrate 100 and the sensor 200. The display layer 300 is able to display image by an electrical signal.

The display layer 300 may include a display component layer DPL and a cover layer ECL. The display component layer DPL may include a display device generating an image according to an electric signal. The display device may include various embodiments. For example, the display device may be an organic light emitting device, a liquid crystal device, an electrophoretic device, or an electrowetting device.

The cover layer ECL is arranged on the display component layer DPL. The cover layer ECL may include an insulation material. The cover layer ECL protects the display component layer DPL from the outside.

In this exemplary embodiment, the sensor 200 may be overlapped with the display layer 300 disposed. Thus, the sensor 200 may be optically transparent. An image formed on the display layer 300 may be seen easily by the user through the transparent sensor 200.

As shown in FIG. 13B, in the electronic device 10-6, the display layer 300 may be disposed on the sensor 200. In this time, the sensor 200 may make less impact on the visibility of the image displayed on display layer 300.

Thus, the sensor 200 may be formed of optically non-transparent material so that the sensor 200 may be easily formed through various materials.

FIG. 14A to 14E are cross-sectional views showing a manufacturing method of the electronic device according to an exemplary embodiment of the disclosure. Hereinafter, a manufacturing method of the electronic device will be explained in detail with reference to the FIG. 14A to FIG. 14E. FIG. 14A to FIG. 14E exemplarily illustrate the manufacturing method of the electronic device shown in FIG. 10A.

Figure 14A:
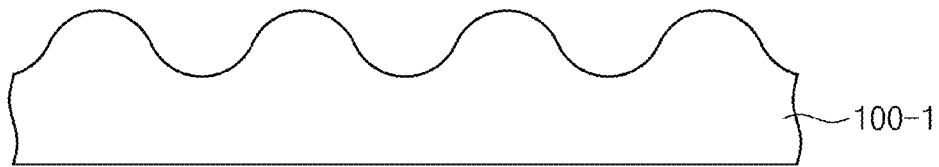
FIG. 14A, FIG. 14B, FIG. 14C, FIG. 14D and FIG. 14E are cross-sectional views showing a manufacturing method of the electronic device according to an exemplary embodiment.
Figure 14B:
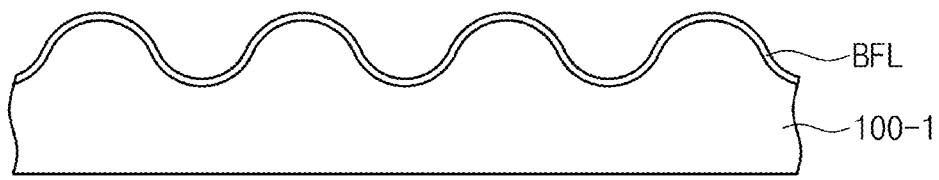

As shown, FIG. 14A provides a base substrate 100-1 including concave portions and convex portions formed on the upper surface. The base substrate 100-1 includes a lower surface and an upper surface which includes peaks and valleys having different thickness. As shown in FIG. 14B, a buffer layer BFL is formed on the base substrate 100-1. The buffer layer BFL covers the upper surface of the base substrate 100-1 formed by a deposition process or a coating process.

For example, the buffer layer BFL may be formed of aluminum oxide through an atomic layer deposition process. The buffer layer BFL can be formed stably on the surface of the concave and convex, the buffer layer BFL could even include a metal pattern disposed on the buffer layer BFL.

Figure 14C:
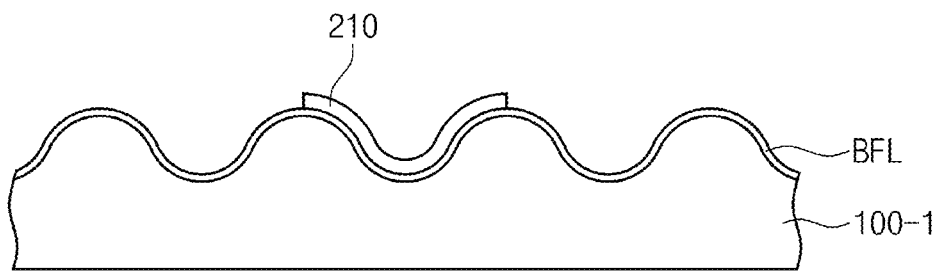

Next, as shown in FIG. 14C, the first electrode 210 is formed. The first electrode 210 may be formed by direct patterning a conducting material on the buffer layer BFL.

The first electrode 210 may be formed stably on the base substrate 100-1 with high binding force through the buffer layer BFL.

Meanwhile, the first electrode 210 may be formed along the upper surface shape of the base substrate 100-1. Thus, the first electrode 210 may be formed with the shape reflecting the upper surface shape of the base substrate 100-1. The first electrode 210 may be formed with a wave shape in a cross section.

For example, the first electrode 210 may be formed of composite PEDOT: PSS/PU which is manufactured by coating process with the use of a stencil mask. Then, a predetermined heat treatment process may proceed. Therefore, the first electrode 210 may be formed stably even as a thin film.

Figure 14D:
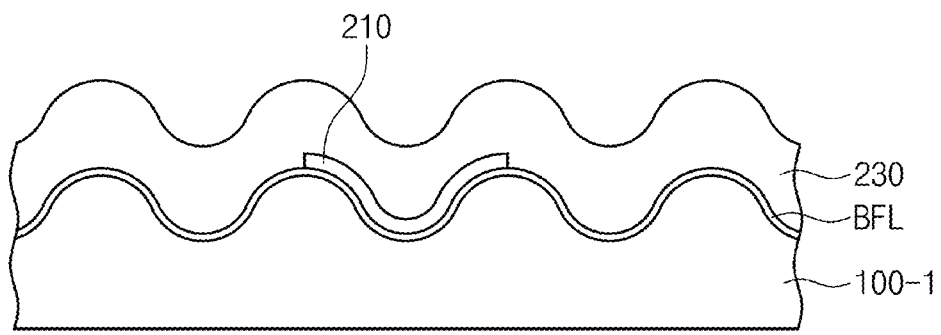

Next, as shown in FIG. 14D, the dielectric layer 230 is formed. The dielectric layer 230 may be formed on the buffer layer BFL or base substrate 100-1 by applying or depositing an insulation material. Thus, the upper surface of the dielectric layer 230 may be formed by reflecting the upper surface of the base substrate 100-1.

For example, a coating layer made of waterborne polyurethane is formed to be a coating layer on the upper surface of the base substrate 100-1 or the upper surface of the buffer layer BFL by using a spin coating process. Then, the dielectric layer 230 may be formed after a predetermined heat treatment process.

Figure 14E:
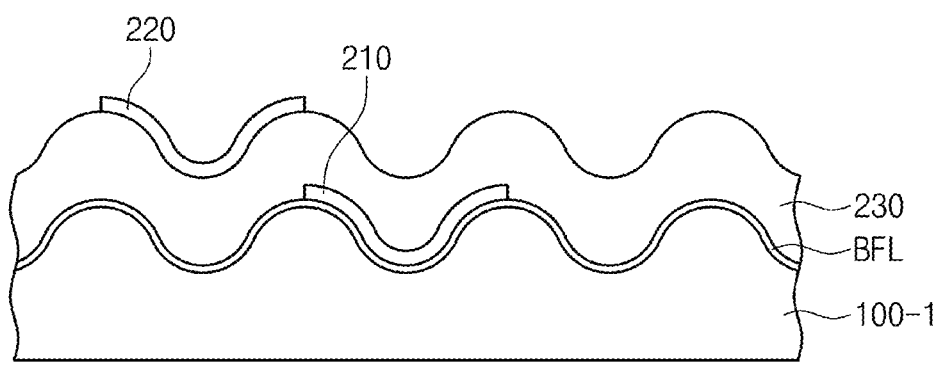

Next, as shown in FIG. 14E, the second electrode 220 is formed. The second electrode 220 may be formed by patterning a conducting material on the dielectric layer 230. For example, after a layer including a composite PEDOT: PSS/PU forms on the dielectric layer 230, the second electrode 220 may be formed by patterning the layer. The second electrode 220 may include shape reflecting the upper surface of the dielectric layer 230, therefore, may be formed with the wave shape in the cross section.

According an embodiment, this disclosure provides an electronic device capable of sensing all of the touch location information and the touch intensity information through one sensor.

According to another embodiment, this disclosure provides an electronic device capable of preventing the decreasing of the touch sensitivity even when a shape is changed by an external force.

According to a further embodiment, this disclosure provides a multi-functional electronic device capable of sensing touch information and a deformation degree due to the external force through one sensor.

Although the exemplary embodiments have been described, it is understood that the present disclosure should not be limited to these exemplary embodiments but various changes and modifications can be made by one ordinary skilled in the art within the spirit and scope of the present disclosure as hereinafter claimed. Therefore, the technical scope of the present disclosure should not be limited to the contents described in the detailed description of the specification, but should be defined by the claims.

What is claimed is:

1. An electronic device, comprising: a base substrate configured to change an area and to expand in a plan view in response to an external force applied from outside; and a sensor disposed on the base substrate, configured to sense a touch applied from the outside, and configured to change an area and to expand in the plan view in response to the external force applied from the outside; wherein the sensor comprises: a first electrode disposed on the base substrate; a second electrode disposed on the base substrate and forming an electric field with the first electrode; and a dielectric layer disposed between the first electrode and the second electrode; and wherein a thickness of the dielectric layer is configured to stay substantially the same when the base substrate and the sensor stretch in a horizontal direction, wherein each of the area in the plan view of the base substrate and the sensor is a projected area in the plan view, wherein an upper surface of the base substrate comprises a plurality of concave portions and convex portions in a normal mode without the external force being applied, wherein when the base substrate is stretched horizontally and when the base substrate is not stretched horizontally, the area of the upper surface of the base substrate is not changed.

2. The electronic device of claim 1, wherein the base substrate has a first area in the plan view in a first mode in which the external force is 0 MPa and a second area in the plan view in a second mode in which the external force is bigger than 0 MPa.

3. The electronic device of claim 2, wherein the second area is larger than the first area.

4. The electronic device of claim 2, wherein an upper surface area of the dielectric layer in the first mode is substantially the same as another upper surface area of the dielectric layer in the second mode.

5. The electronic device of claim 4, wherein the area in the plan view of the dielectric layer in the first mode is smaller than the area in the plan view of the dielectric layer in the second mode.

6. The electronic device of claim 1, wherein the base substrate further comprises a plurality of peak intervals and valley intervals.

7. The electronic device of claim 6, wherein a lower surface of the base substrate is flat.

8. The electronic device of claim 2, wherein a thickness of the base substrate in the first mode is greater than a thickness of the base substrate in the second mode.

9. The electronic device of claim 6, wherein a thickness of the dielectric layer in an area overlapping the peak intervals is substantially the same as a thickness of the dielectric layer in the area overlapping the valley intervals.

10. The electronic device of claim 1, wherein the second electrode comprises a piezo-resistance material.

11. The electronic device of claim 10, wherein the first electrode and the second electrode comprise the same material.

12. The electronic device of claim 1, wherein the first electrode and the second electrode are optically transparent.

13. The electronic device of claim 1, wherein the first electrode and the second electrode comprise a different material from each other.

14. The electronic device of claim 13, wherein a thickness of the first electrode changes when the area in the plan view of the base substrate changes.

15. An electronic device, comprising; a base substrate having elasticity and comprising an upper surface, wherein the upper surface further comprises a plurality of concave portions and convex portions in a normal mode without an external force being applied; and a sensor disposed on the upper surface and configured to sense a touch applied from the outside; wherein the sensor comprises a first electrode disposed on the upper surface; a second electrode disposed on the first electrode and comprising a piezo-resistance material; and a dielectric layer having elasticity and disposed between the first electrode and the second electrode, wherein a thickness of the dielectric layer is configured to stay the same when the base substrate and the first and second electrode stretch in a horizontal direction.

16. The electronic device of claim 15, wherein the sensor is configured to sense a location and an intensity of the touch.

17. The electronic device of claim 16, wherein a resistance of the second electrode is inversely proportional to the intensity of the touch.

18. The electronic device of claim 15, wherein the base substrate has a first area in a plan view in a first mode in which a first external force is applied from the outside and a second area in the plan view in a second mode in which a second external force greater than the first external force is applied.

19. The electronic device of claim 18, wherein the base substrate is alternately arranged and the concave portions and convex portions further comprises peak intervals and valley intervals, wherein a height of each of peak intervals and a depth of each of valley intervals are different from each other in the first mode and the second mode.

20. The electronic device of claim 19, wherein a thickness variation of the first electrode caused by the first external force is different from a thickness variation of the second external force caused by the second external force.

21. The electronic device of claim 20, wherein the sensor is configured to sense an elongation degree of the base substrate.

22. The electronic device of claim 18, wherein a thickness of the dielectric layer in the first mode is substantially the same as a thickness of the dielectric layer in the second mode.

23. The electronic device of claim 22, wherein an area of the upper surface of the second electrode is substantially the same in the first mode and the second mode.

24. The electronic device of claim 15, further comprising a display layer disposed between the base substrate and the sensor, the display layer configured to display an image, wherein the first electrode and the second electrode are optically transparent.

25. An electronic device, comprising: a base substrate configured to change an area and to expand in a plan view in response to an external force applied from outside; and a sensor disposed on the base substrate, configured to sense a touch applied from the outside, and configured to change an area and to expand in the plan view in response to the external force applied from the outside; wherein the sensor comprises: a first electrode disposed on the base substrate; a second electrode disposed on the base substrate and forming an electric field with the first electrode; and a dielectric layer disposed between the first electrode and the second electrode, wherein a thickness of the dielectric layer is configured to stay the same when the base substrate and the sensor stretch in a horizontal direction, wherein an upper surface of the base substrate comprises a plurality of concave portions and convex portions, and wherein when the external force is not applied to the base substrate, height differences between the concave portions and the convex portions are greater than height differences between the concave portions and the convex portions when the external force is applied to the base substrate.

* * * * *